(12) United States Patent
Moon et al.

(10) Patent No.: US 11,202,363 B2
(45) Date of Patent: Dec. 14, 2021

(54) HEAT TRANSFER MEMBER AND ELECTRONIC DEVICE INCLUDING THE SAME

(71) Applicant: Samsung Electronics Co., Ltd., Gyeonggi-do (KR)

(72) Inventors: Hongki Moon, Gyeonggi-do (KR); Yoonsun Park, Gyeonggi-do (KR); Seunghoon Kang, Gyeonggi-do (KR); Kyungha Koo, Gyeonggi-do (KR); Hajoong Yun, Gyeonggi-do (KR); Seungjoo Lee, Gyeonggi-do (KR); Yeonjoo Lee, Gyeonggi-do (KR); Seyoung Jang, Gyeonggi-do (KR)

(73) Assignee: Samsung Electronics Co., Ltd

( * ) Notice: Subject to any disclaimer, the term of this patent is extended or adjusted under 35 U.S.C. 154(b) by 0 days.

(21) Appl. No.: 16/795,223

(22) Filed: Feb. 19, 2020

(65) Prior Publication Data
US 2020/0267828 A1 Aug. 20, 2020

(30) Foreign Application Priority Data
Feb. 19, 2019 (KR) .......................... 10-2019-0019015

(51) Int. Cl.
*H05K 1/02* (2006.01)
*H02J 50/27* (2016.01)

(52) U.S. Cl.
CPC ............ *H05K 1/0203* (2013.01); *H02J 50/27* (2016.02); *H05K 2201/10037* (2013.01); *H05K 2201/10128* (2013.01)

(58) Field of Classification Search
CPC ....... H05K 1/0203; H05K 2201/10037; H05K 2201/101128; H02J 50/27
See application file for complete search history.

(56) References Cited

U.S. PATENT DOCUMENTS

| 2005/0039879 A1* | 2/2005 | Hanai ................ H05K 7/20454 165/46 |
| 2015/0323262 A1 | 11/2015 | Kim |

(Continued)

FOREIGN PATENT DOCUMENTS

| JP | 2013-243497 | 12/2013 |
| KR | 10-2015-0127473 | 11/2015 |

(Continued)

OTHER PUBLICATIONS

International Search Report dated May 28, 2020 issued in counterpart application No. PCT/KR2020/002224, 9 pages.

*Primary Examiner* — Mukundbhai G Patel
(74) *Attorney, Agent, or Firm* — The Farrell Law Firm, P.C.

(57) ABSTRACT

An electronic device for improving heat transfer is provided. The electronic device includes a housing, a display mounted on at least one surface of the housing, a battery, a supporting member disposed adjacent to a back surface of the display and supporting the display, a printed circuit board on which electronic components are mounted, a shield can surrounding at least a portion of the electronic components, a shielding structure disposed on an outer surface of the shield can to shield the electronic components, and a first heat transfer member disposed on an outer surface of the shielding structure and including a partial area that faces at least one electronic component among the plurality of electronic components mounted on the printed circuit board and another partial area that is bent and faces another electronic component among the plurality of electronic components mounted on the printed circuit board.

20 Claims, 18 Drawing Sheets

(56) References Cited

U.S. PATENT DOCUMENTS

| | | | |
|---|---|---|---|
| 2016/0313773 A1 | 10/2016 | Kim et al. | |
| 2016/0341486 A1* | 11/2016 | Kim | ............... H01L 23/427 |
| 2018/0035528 A1* | 2/2018 | Kim | ............... G06F 1/203 |
| 2018/0220549 A1 | 8/2018 | Ritter et al. | |
| 2019/0041909 A1 | 2/2019 | Pakula et al. | |
| 2019/0044391 A1 | 2/2019 | Jung et al. | |
| 2019/0051967 A1 | 2/2019 | Ryu et al. | |
| 2020/0100389 A1 | 3/2020 | Park et al. | |
| 2021/0041926 A1 | 2/2021 | Park et al. | |

FOREIGN PATENT DOCUMENTS

| | | |
|---|---|---|
| KR | 1020160125804 | 11/2016 |
| KR | 1020170093029 | 8/2017 |
| KR | 1020170097541 | 8/2017 |
| KR | 1020180126849 | 11/2018 |
| KR | 1020190008067 | 1/2019 |
| KR | 1020190098606 | 8/2019 |

* cited by examiner

HEAT TRANSFER MEMBER AND ELECTRONIC DEVICE INCLUDING THE SAME

CROSS-REFERENCE TO RELATED APPLICATION(S)

This application is based on and claims priority under 35 U.S.C. § 119 to Korean Patent Application No. 10-2019-0019015, filed on Feb. 19, 2019, in the Korean Intellectual Property Office, the entire disclosure of which is incorporated herein by reference.

BACKGROUND

1. Field

The disclosure relates generally to a heat transfer member and an electronic device including the same.

2. Description of Related Art

Advances in mobile technology are leading to increased demand for more compact and lightweight portable terminals, e.g., smartphones, with maximized user portability and convenience along with the integration of parts in a smaller space for higher performance.

As electronic components used in electronic devices provide higher performance and capability, they often radiate more heat, influencing nearby components and deteriorating the overall performance.

For example, an electronic device may have a main circuit board that is elongated in the lengthwise direction of the electronic device, e.g., in the shape of the letter "I." At least a portion of the battery positioned adjacent to the main circuit board may be flush with the main circuit board. When at least a portion of the battery is flush with the I-shaped main circuit board, an increase in the size of the main circuit board may impose limitations the available space for placing the battery. The I-shaped main circuit board, as viewed from above the electronic device, may be sized to correspond to the mounting area of electronic components. Thus, placing a larger-capacity battery compromises the miniaturization of the mounting area of electronic components of the electronic device.

To put a larger battery in an electronic device, a half printed circuit board (PCB), i.e., a PCB that takes up about a half of the overall size of the display, may be used.

To avoid a substantial reduction in the mounting space for electronic components, a stacked PCB structure may be used in order to secure an extra mounting area for the electronic components. If an electronic device utilizes a half PCB and a stacked PCB, major heating components (e.g., an application processor (AP) or a $5^{th}$ generation (5G) modem) of the electronic device may be disposed close to each other on the main circuit board. Consequently, the heat generated while the electronic device operates may be concentrated at one portion (e.g., the top) of the electronic device, which may cause performance deterioration of the electronic device. Thus, heatsinking and cooling of the heating source may be needed.

Additionally, 5G antennas and radio frequency integrated circuits (RFICs) for 5G communication may be mounted in separate modules from the heating sources that are mounted on the main circuit board. Thus, they may need a separate cooler.

SUMMARY

The disclosure is designed to address at least the problems and/or disadvantages described above and to provide at least the advantages described below.

According to an aspect of the disclosure, a heat radiating structure is provided that may efficiently transfer the heat generated from a portion (e.g., the top) of an electronic device to another portion (e.g., the bottom) of the electronic device, which is relatively lower in temperature.

According to another aspect of the disclosure, a heat radiating structure is provided that may cool the modularized heating sources in an electronic device by transfer, spreading, scattering, or discharging the heat generated from the heating sources.

In accordance with an aspect of the disclosure, an electronic device is provided, which includes a housing, a display mounted on at least one surface of the housing, a battery, a supporting member disposed adjacent to a back surface of the display and supporting the display, a printed circuit board on which electronic components are mounted, a shield can surrounding at least a portion of the electronic components, a shielding structure disposed on an outer surface of the shield can to shield the electronic components, and a first heat transfer member disposed on an outer surface of the shielding structure and including a partial area that faces at least one electronic component among the plurality of electronic components mounted on the printed circuit board and another partial area that is bent and faces another electronic component among the plurality of electronic components mounted on the printed circuit board.

In accordance with another aspect of the disclosure, an electronic device is provided, which includes a housing including a front plate facing in a first direction, a back plate facing in a second direction opposite to the first direction, a supporting member disposed between the front plate and the back plate to form a space, a first area dividing the space along a lengthwise direction from an end of the supporting member, and a second area positioned adjacent to the first area and dividing the space in parallel with the first area, a printed circuit board on which a plurality of electronic components are mounted, the printed circuit board being disposed in the first area, and including a first printed circuit board on which a first plurality of electronic components are mounted and a second printed circuit board at least partially overlapping the first printed circuit board and electrically connected with the first printed circuit board, a battery disposed in the second area, and a first heat transfer member including a partial area that faces at least one electronic component among the first plurality of electronic components mounted on the first printed circuit board and at least another partial area that is bent and faces another electronic component among the first plurality of electronic components mounted on the first printed circuit board.

BRIEF DESCRIPTION OF THE DRAWINGS

The above and other aspects, features, and advantages of certain embodiments of the disclosure will be more apparent from the following detailed description taken in conjunction with the accompanying drawings, in which.

DETAILED DESCRIPTION

Various embodiments of the disclosure will now be described in detail with reference to the accompanying drawings. In the following description, specific details such as detailed configuration and components are merely provided to assist the overall understanding of these embodiments. Therefore, it should be apparent to those skilled in the art that various changes and modifications of the embodiments described herein can be made without departing from the scope and spirit of the disclosure.

In addition, descriptions of well-known functions and constructions are omitted for clarity and conciseness.

Figure 1:
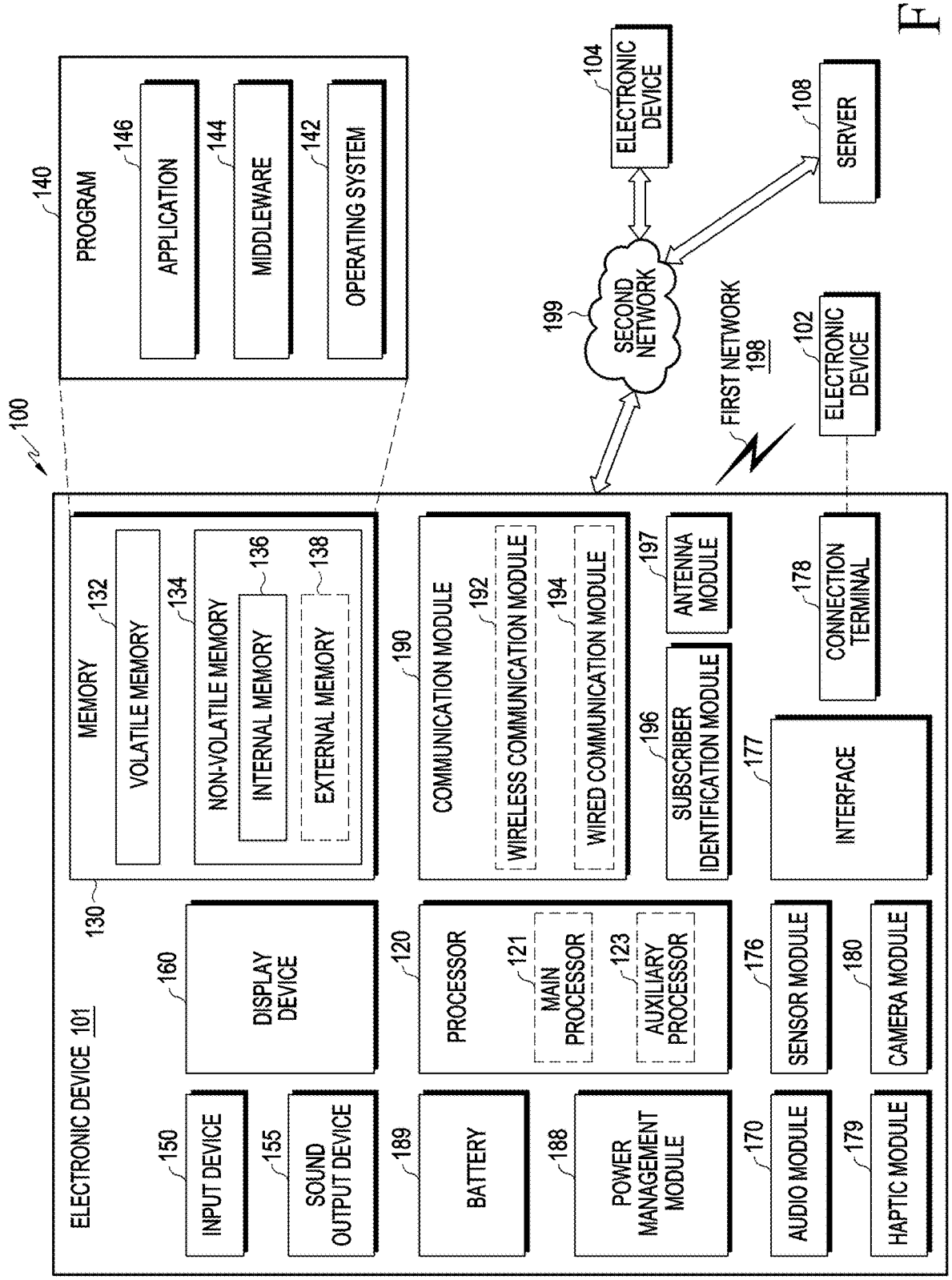
FIG. 1 illustrates an electronic device in a network environment according to an embodiment.

FIG. 1 illustrates an electronic device 101 in a network environment 100 according to an embodiment.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, e.g., software (e.g., a program 140) to control at least one other component (e.g., a hardware or software component) of the electronic device 101 connected with the processor 120 and may process or compute various data. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an AP), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one (e.g., the display device 160, the sensor module 176, or the communication module 190) of the components of the electronic device 101, instead of the main processor 121 while the main processor 121 is in an inactive (e.g., sleep) state or along with the main processor 121 while the main processor 121 is an active state (e.g., executing an application). According to an embodiment, the auxiliary processor 123 (e.g., an ISP or a CP) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by another component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming call. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain a sound through the input device 150 or output a sound through the sound output device 155 or an external electronic device (e.g., an electronic device 102 (e.g., a speaker or a headphone) directly or wirelessly connected with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, ISPs, or flashes.

The power management module 188 may manage power supplied to the electronic device 101. According to one embodiment, the power management module 388 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or wireless communication channel between the electronic device 101 and an external electronic device (e.g., the electronic device 102, the electronic device 104, or the server 108) and performing communication through the established communication channel. The communication module 190 may include one or more CPs that are operable independently from the processor 120 (e.g., the AP) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module may include one antenna including a radiator formed of a conductor or conductive pattern formed on a substrate (e.g., a PCB). According to an embodiment, the antenna module 197 may include a plurality of antennas. In this case, at least one antenna appropriate for a communication scheme used in a communication network, such as the first network 198 or the second network 199, may be selected from the plurality of antennas by, e.g., the communication module 190. The signal or the power may then be transmitted or received between the communication module 190 and the external electronic device via the selected at least one antenna. According to an embodiment, other parts (e.g., an RFIC) than the radiator may be further formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. The first and second external electronic devices 102 and 104 each may be a device of the same or a different type from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2A:
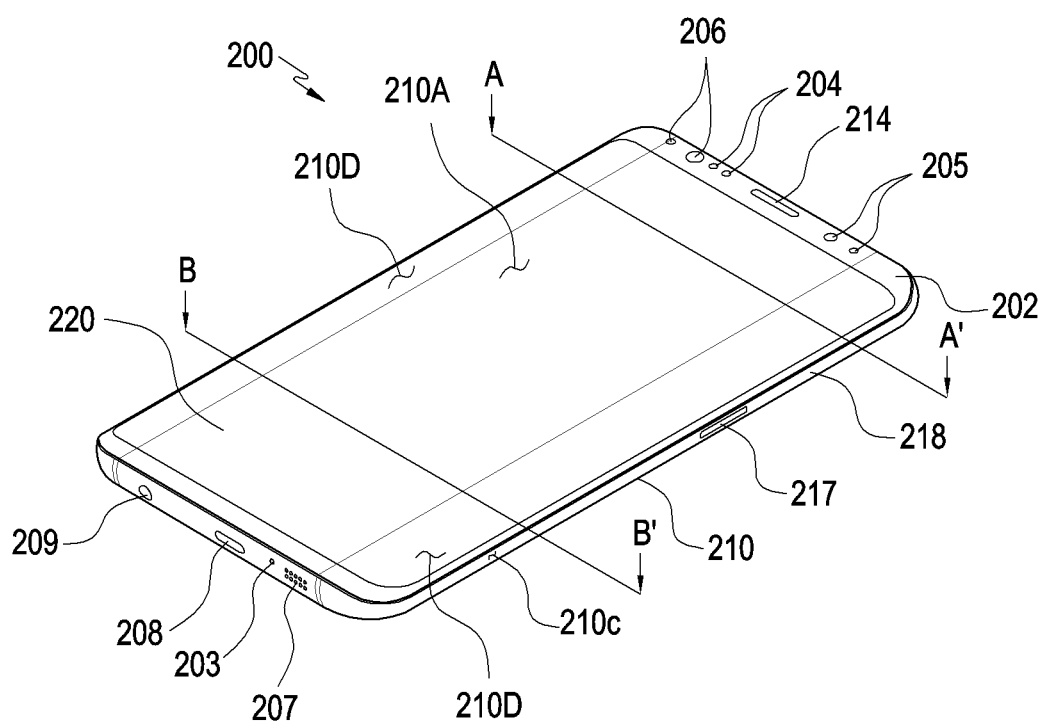
FIG. 2A illustrates a front perspective view of an electronic device according to an embodiment.
Figure 2B:
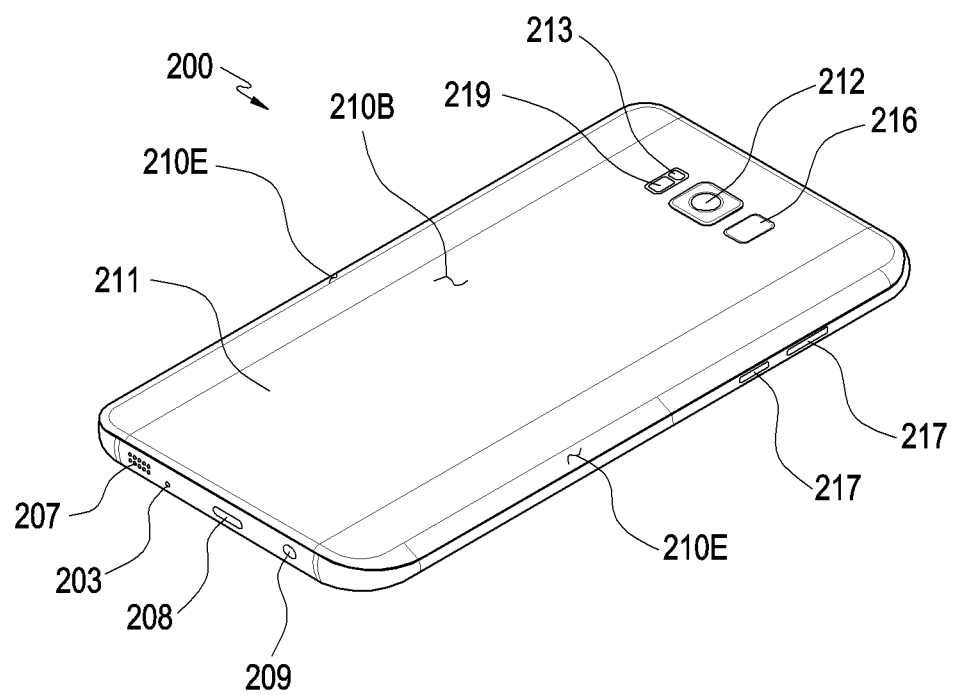
FIG. 2B illustrates a rear perspective view of an electronic device according to an embodiment.

FIG. 2A illustrates a front perspective view of an electronic device according to an embodiment. FIG. 2B illustrates a rear perspective view of an electronic device according to an embodiment.

Referring to FIGS. 2A and 2B, an electronic device 200 includes a housing 210 with a first (or front) surface 210A, a second (or back) surface 210B, and a side surface 210C surrounding a space between the first surface 210A and the second surface 210B. Alternatively, the housing may denote a structure forming part of the first surface 210A, the second surface 210B, and the side surface 210C of FIG. 2A. At least part of the first surface 210A may have a substantially transparent front plate 202 (e.g., a glass plate or polymer plate including various coat layers). The second surface 210B may be formed of a substantially opaque back plate 211. The back plate 211 may be formed of laminated or colored glass, ceramic, polymer, metal (e.g., aluminum, stainless steel (SUS), or magnesium), or a combination of at least two thereof. The side surface 210C may be formed by a side bezel structure (or a "side member") 218 that couples to the front plate 202 and the back plate 211 and includes a metal and/or polymer. The back plate 211 and the side bezel plate 218 may be integrally formed together and include the same material (e.g., a metal, such as aluminum).

The front plate 202 includes two first regions 210D, which seamlessly and bendingly extend from the first surface 210A to the back plate 211, on both the long edges of the front plate 202. As illustrated in FIG. 2A, the back plate 211 includes two second regions 210E, which seamlessly and bendingly extend from the second surface 210B to the front plate 202, on both the long edges. The front plate 202 (or the back plate 211) may include only one of the first regions 210D (or the second regions 210E). Alternatively, the first regions 210D or the second regions 210E may partially be excluded. At side view of the electronic device 200, the side bezel structure 218 may have a first thickness (or width) for sides that do not have the first regions 210D or the second regions 210E and a second thickness, which is smaller than the first thickness, for sides that have the first regions 210D or the second regions 210E.

The electronic device 200 includes a display 220, audio modules 203, 207, and 214, sensor modules 204, 216, and 219, camera modules 205, 212, and 213, key input devices 217, a light emitting device 206, and connector holes 208 and 209. Alternatively, the electronic device 200 may exclude at least one of the components (e.g., the key input device 217 or the light emitting device 206) or may add other components.

Figure 2C:
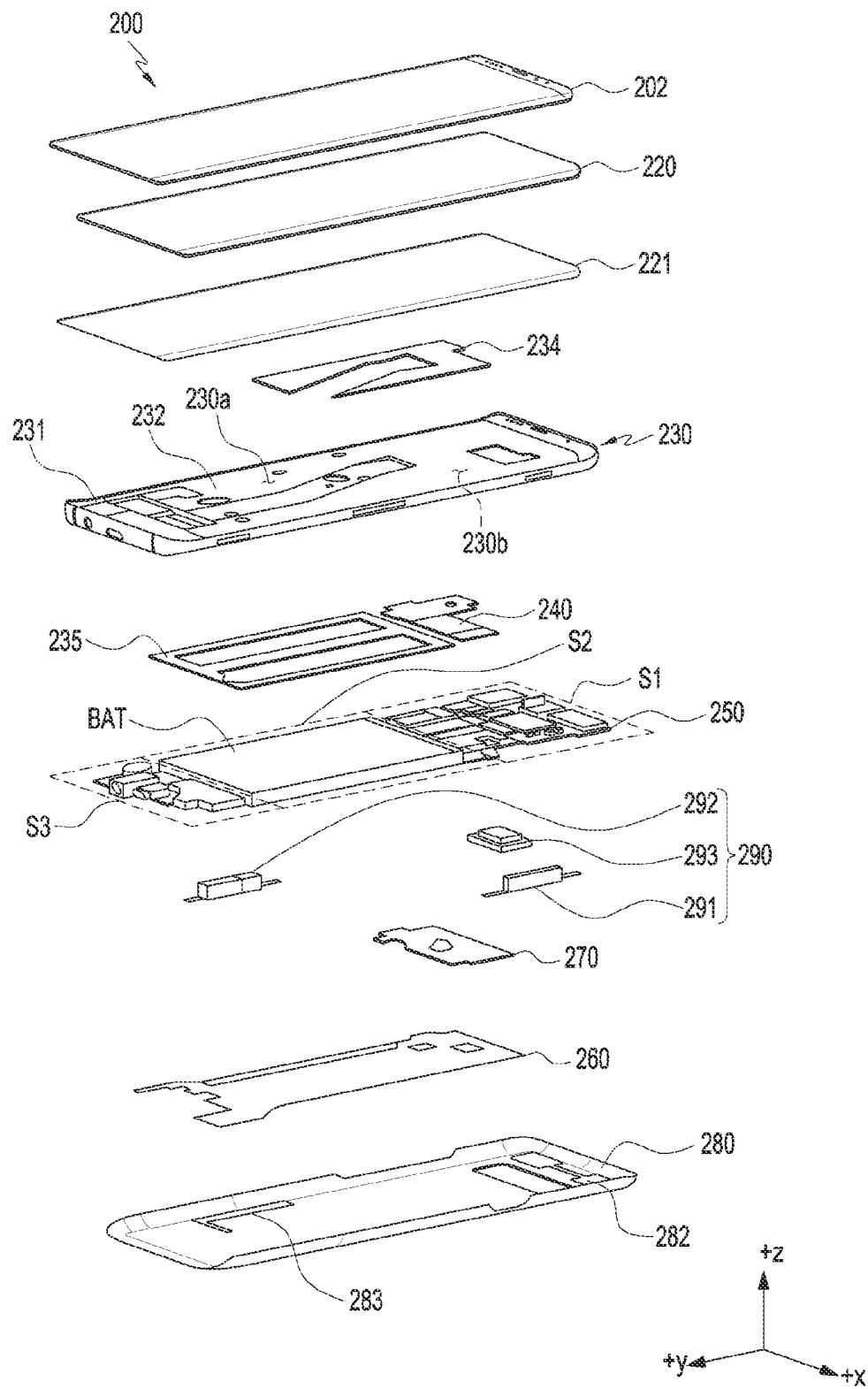
FIG. 2C illustrates an exploded perspective view of an electronic device according to an embodiment.

FIG. 2C illustrates an exploded perspective view of an electronic device according to an embodiment.

Referring to FIG. 2C, an electronic device 200 includes a front plate 202, a display 220, a supporting member 230 (or a first supporting member) (e.g., a bracket), a PCB 250, a battery (BAT), an antenna 260, a second supporting member 270 (e.g., a clad metal (SUS/copper (Cu)/SUS layer) material), and a back plate 280. Alternatively, the electronic device 200 may exclude at least one of the components or may add another component.

The supporting member 230 may be disposed inside the electronic device 200 to be connected with the side bezel structure 231 or integrated with the side bezel structure 231. FIG. 2C illustrates an example in which the side bezel structure 231 is integrally formed with the supporting member 230. The supporting member 230 may have a seating part 232 formed in a size corresponding to the display 220. The display 220 may be coupled to one surface 230a of the supporting member 230, and the PCB 250 may be coupled to the opposite surface 230b of the supporting member 230. The supporting member 230 may include a rigid portion to support at least a portion of the PCB 250. The supporting member 230 may be formed of, e.g., a metal and/or non-metallic material (e.g., polymer).

The supporting member 230 may touch the back surface of the display 220 and support at least a portion of the display 220. The supporting member 230 may support at least a portion of the PCB 250 on a different surface from the surface touching the display 220.

Various electronic components, e.g., a processor, memory, and/or interface, may be mounted on the PCB 250.

The processor may include one or more of, e.g., a CPU, an AP, a GPU, an ISP, a sensor hub processor, or a CP. The memory may include, e.g., a volatile or non-volatile memory. The interface may include a high definition multimedia interface (HDMI), a universal serial bus (USB) interface, a secure digital (SD) card interface, and/or an audio interface. The interface may electrically or physically connect the electronic device 200 with an external electronic device and may include a USB connector, an SD card/multimedia card (MMC) connector, or an audio connector.

At least part of the front surface of the electronic device may have a substantially transparent front plate 202 (e.g., a glass plate or polymer plate including various coat layers). The back surface of the electronic device may be formed by the back plate 280 which is substantially opaque (e.g., laminated or colored glass, ceramic, polymer, metal (e.g., aluminum, SUS, or magnesium), or a combination of at least two thereof). The side surface of the electronic device may be formed by the side bezel structure 231 that couples to the front plate 202 and the back plate 280 and includes a metal and/or polymer.

The side bezel structure 231 may be integrated with the supporting member 230. The back plate 280 and the side bezel plate 231 may be integrally formed together and include the same material (e.g., a metal, such as aluminum).

The display 220 may be exposed through a portion of the front plate 202. The edge of the display 220 may be formed to be substantially the same in shape as an adjacent outer edge of the front plate 202. The interval between the outer edge of the display 220 and the outer edge of the front plate 202 may remain substantially even to give a larger area of exposure the display 220.

The electronic device 200 may include various elements for transferring the heat generated from the inside of the electronic device to a relatively low-temperature place. For example, the electronic device 200 may include at least one heat transfer member.

The electronic device may include a first heat transfer member 240. At least a partial area of the first heat transfer member 240 may be disposed to face at least one electronic component among a plurality of electronic components mounted on the PCB 250, and at least another partial area, which is bent, may be disposed to face another electronic component among the plurality of electronic components mounted on the PCB 250. The first heat transfer member 240 may be shaped to cover at least a portion of the PCB 250.

The electronic device may include a second heat transfer member 235 disposed to face at least one surface (e.g., 230b) of the supporting member 230. The second heat transfer member 235 may be disposed between the supporting member 230 and the battery. At least a portion of the first heat transfer member 240 may be disposed in parallel with the second heat transfer member 235 along the lengthwise direction of the electronic device.

The housing may include a first area (e.g., S1 of FIG. 2C) that divides the space from an end of the supporting member 230 along the lengthwise direction. The PCB 250 is disposed in the first area. The housing may include a second area (e.g., S2 of FIG. 2C) that is positioned adjacent to the first area and divides the space in parallel with the first area. The battery for power supply is disposed in the second area. The housing may include a third area (e.g., S3 of FIG. 2C) that is positioned adjacent to the second area (e.g., S2 of FIG. 2C). An auxiliary PCB (e.g., a PCB on which an interface is formed) is formed in the third area.

The first heat transfer member 240 may be disposed in an area corresponding to at least a portion of the first area S1, and the second heat transfer member 235 may be disposed in an area S2 corresponding to at least a portion of the second area.

The electronic device may further include a third heat transfer member 234 that is disposed on a surface 230a opposite to the surface 230b of the supporting member 230 on which the second heat transfer member 235 is disposed. The third heat transfer member 234 may be disposed between the display 220 and the supporting member 230. The third heat transfer member 234 may be disposed in an area corresponding to at least a portion of the first area and at least a portion of the second area.

The electronic device 200 may include at least one heat radiating sheet and/or at least one heat transfer material.

A heat radiating sheet 221 (or thin film or plate) formed of Cu or a high-thermal conductivity carbon-based material (e.g., carbon black, graphene, carbon nano tube, graphite, etc.) may be disposed on the back surface of the display 220. The electronic device 200 may further include other heat radiating sheets and/or heat transfer materials.

The battery may supply power to at least one component of the electronic device 200. The battery may include a primary cell, which is not rechargeable, a secondary cell, which is rechargeable, and/or a fuel cell. The battery may be received in the housing. At least a portion of the battery may be disposed on substantially the same plane as (e.g., flush with) the PCB 250. The battery may be integrally formed inside the electronic device 200. Alternatively, the battery may be detachably disposed in the electronic device 200.

The antenna 260 may be disposed between the back plate 280 and the battery. The antenna 260 may include a near-field communication (NFC) antenna, a wireless charging antenna, and/or a magnetic secure transmission (MST) antenna. The antenna 260 may perform short-range communication with an external device or may wirelessly transmit or receive power for charging. An antenna structure may be formed by a portion or combination of the seating part 232 and/or the side bezel structure 231 constituting the supporting member 230.

The electronic device 200 may include an antenna module 290. For example, part of the antenna module 290 may be implemented to transmit or receive radio waves with different characteristics (referred to as radio waves of frequency bands A and B) to implement multiple-input multiple-output (MIMO). As another example, part of the antenna module 290 may be configured to simultaneously transmit or receive radio waves with the same characteristic (referred to as radio waves of frequencies A1 and A2 in frequency band A) to implement diversity. Another part of the antenna module 290 may be configured to simultaneously transmit or receive radio waves with the same characteristic (referred to as radio waves of frequencies B1 and B2 in frequency band B) to implement diversity. Two antenna modules may be included. Alternatively, the electronic device 200 may include four antenna modules to implement both MIMO and diversity. The electronic device 200 may include only one antenna module 290.

Given the transmission and reception nature of radio waves, when one antenna module is disposed in a first position of the printed circuit board 250, another antenna module may be disposed in a second position, which is separated from the first position, of the printed circuit board 250. As another example, one antenna module and another antenna module may be disposed considering the distance therebetween depending on diversity characteristics.

The antenna module 290 may include a wireless communication circuit to process radio waves transmitted or received in a high frequency band (e.g., 6 GHz or more and 300 GHz or less). The conductive plate of the antenna module 290 may be formed of a dipole-structured conductive plate extending in one direction or a patch-type radiating conductor. A plurality of conductive plates may be arrayed to form an antenna array. A chip (e.g., an integrated circuit (IC) chip) in which part of the wireless communication circuit is implemented may be disposed on the opposite surface of the surface on which the conductive plate is disposed or on one side of the area where the conductive plate is disposed and may be electrically connected with the conductive plate via a line which is formed of a printed circuit pattern.

Figure 3:
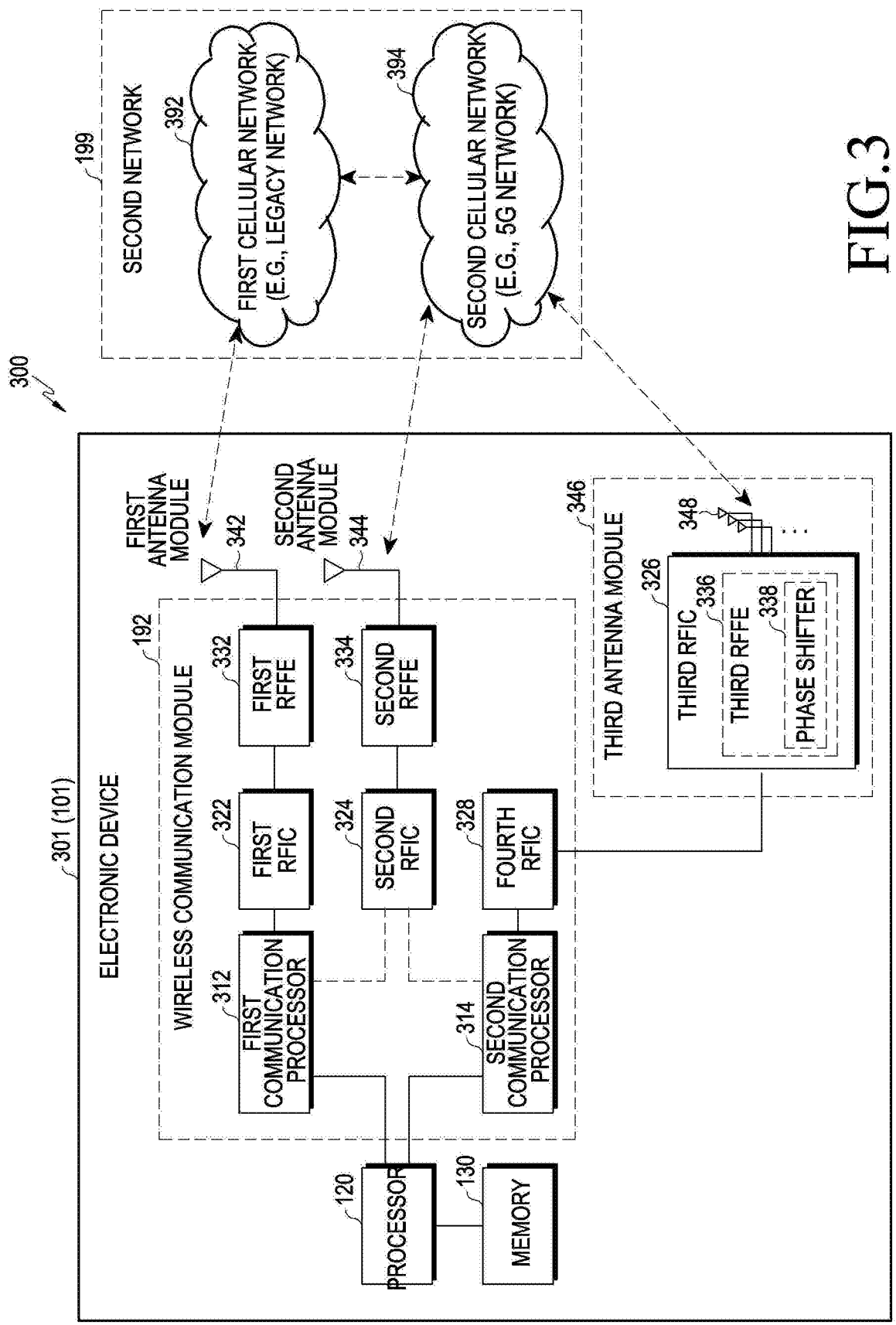
FIG. 3 illustrates an electronic device in a network environment including a plurality of cellular networks according to an embodiment.

FIG. 3 illustrates an electronic device in a network environment including a plurality of cellular networks according to an embodiment.

Referring to FIG. 3, an electronic device 301 includes a first CP 312, a second CP 314, a first RFIC 322, a second RFIC 324, a third RFIC 326, a fourth RFIC 328, a first radio frequency front end (RFFE) 332, a second RFFE 334, a first antenna module 342, a second antenna module 344, and an antenna 348. The electronic device 301 further includes a processor 120 and a memory 130. The second network 199 may include a first cellular network 392 and a second cellular network 394. The electronic device 301 may also include at least one of the components of FIG. 2, and the second network 199 may further include at least one other network. The first CP 312, the second CP 314, the first RFIC 322, the second RFIC 334, the fourth RFIC 328, the first RFFE 332, and the second RFFE 334 may form at least part of the wireless communication module 192. The fourth RFIC 328 may be omitted or be included as part of the third RFIC 326.

The first CP 312 may establish a communication channel of a band that is to be used for wireless communication with the first cellular network 392 or may support legacy network communication via the established communication channel. The first cellular network may be a legacy network that includes second generation (2G), third generation (3G), fourth generation (4G), and/or long-term evolution (LTE) networks. The second CP 314 may establish a communication channel corresponding to a designated band (e.g., from about 6 GHz to about 60 GHz) among bands that are to be used for wireless communication with the second cellular network 394 or may support 5G network communication via the established communication channel. The second cellular network 394 may be a 5G network defined by the 3rd generation partnership project (3GPP). Additionally, the first CP 312 or the second CP 314 may establish a communication channel corresponding to another designated band (e.g., about 6 GHz or less) among the bands that are to be used for wireless communication with the second cellular network 394 or may support 5G network communication via the established communication channel. The first CP 312 and the second CP 314 may be implemented in a single chip or a single package. The first CP 312 or the second CP 314, along with the processor 120, an assistance processor 123, or communication module 190, may be formed in a single chip or single package.

The first RFIC 322 may convert a baseband signal generated by the first CP 312 into a radio frequency (RF) signal with a frequency ranging from about 700 MHz to about 3 GHz, which is used by the first cellular network 392 (e.g., a legacy network). The RF signal may be obtained from the first cellular network 392 through the first antenna module 342 and may be pre-processed via the first RFFE 332. The first RFIC 322 may convert the pre-processed RF signal into a baseband signal that may be processed by the first CP 312.

The second RFIC 3324 may convert the baseband signal generated by the first CP 312 or the second CP 314 into a Sub6-band (e.g., about 6 GHz or less) RF signal (hereinafter, referred to as a "5G Sub6 RF signal") that is used by the second cellular network 394.

The 5G Sub6 RF signal may be obtained from the second cellular network 394 through the second antenna module 344 and may be pre-processed via the second RFFE 334. The second RFIC 324 may convert the pre-processed 5G Sub6 RF signal into a baseband signal that may be processed by a corresponding processor of the first CP 312 and the second CP 314.

The third RFIC 326 may convert the baseband signal generated by the second CP 314 into a 5G Above6 band (e.g., from about 6 GHz to about 60 GHz) RF signal (hereinafter, referred to as a "5G Above6 RF signal") that is to be used by the second cellular network 394 (e.g., a 5G network). The 5G Above6 RF signal may be obtained from the second cellular network 394 through the antenna 348 and may be pre-processed via the third RFFE 336. The third RFIC 326 may convert the pre-processed 5G Above6 RF signal into a baseband signal that may be processed by the second CP 314. The third RFFE 336 may be formed as part of the third RFIC 326.

The electronic device 301 may include the fourth RFIC 328 separately from, or as at least part of, the third RFIC 326. In this case, the fourth RFIC 328 may convert the baseband signal generated by the second CP 314 into an intermediate frequency band (e.g., from about 9 GHz to about 11 GHz) RF signal (hereinafter, referred to as an "intermediate frequency (IF) signal") and transfer the IF signal to the third RFIC 326. The third RFIC 326 may convert the IF signal into a 5G Above6 RF signal. The 5G Above6 RF signal may be received from the second cellular network 394 through the antenna 348 and may be converted into an IF signal by the third RFIC 326. The fourth RFIC 328 may convert the IF signal into a baseband signal that may be processed by the second CP 314.

The first RFIC 322 and the second RFIC 3324 may be implemented as at least part of a single chip or single package. The first RFFE 332 and the second RFFE 334 may be implemented as at least part of a single chip or single package. At least one of the first antenna module 342 or the second antenna module 344 may be omitted or be combined with another antenna module to process multi-band RF signals.

The third RFIC 326 and the antenna 348 may be disposed on the same substrate to form the third antenna module 346. For example, the wireless communication module 192 or the processor 120 may be disposed on a first substrate (e.g., a main PCB). The third RFIC 326 and the antenna 348, respectively, may be disposed on one area (e.g., the bottom) and another (e.g., the top) of a second substrate (e.g., a sub PCB), which is provided separately from the first substrate, forming the third antenna module 346.

Placing the third RFIC 326 and the antenna 348 on the same substrate may shorten the length of the transmission line therebetween, which may reduce a loss (e.g., attenuation) of high-frequency band (e.g., from about 6 GHz to about 60 GHz) signal used for 5G network communication due to the transmission line. Thus, the electronic device 101 may enhance the communication quality with the second cellular network 394.

The antenna 348 may be formed as an antenna array that includes a plurality of antenna elements available for beamforming. The third RFIC 326 may include a plurality of phase shifters 338 corresponding to the plurality of antenna elements, as part of the third RFFE 336. The plurality of phase shifters 338 may change the phase of the 5G Above6 RF signal that is to be transmitted to the outside (e.g., a 5G network base station) of the electronic device 301 via their corresponding antenna elements. The plurality of phase shifters 338 may change the phase of the 5G Above6 RF signal received from the outside to the same or substantially the same phase via their corresponding antenna elements in order to perform transmission or reception via beamforming between the electronic device 301 and the outside.

The second cellular network 394 may be operated independently (e.g., in standalone (SA)) from, or in connection (e.g., as non-standalone (NSA)) with the first cellular network 392 (e.g., a legacy network). For example, the 5G network may include access networks (e.g., 5G access networks (RANs)), but lack any core network (e.g., a next-generation core (NGC)). In this case, the electronic device 301, after accessing a 5G network access network, may access an external network (e.g., the Internet) under the control of the core network (e.g., the evolved packet core (EPC)) of the legacy network. Protocol information (e.g., LTE protocol information) for communication with the legacy network or protocol information (e.g., New Radio (NR) protocol information) for communication with the 5G network may be stored in the memory 130 and be accessed by other components (e.g., the processor 120, the first CP 312, or the second CP 314).

Figure 4A:
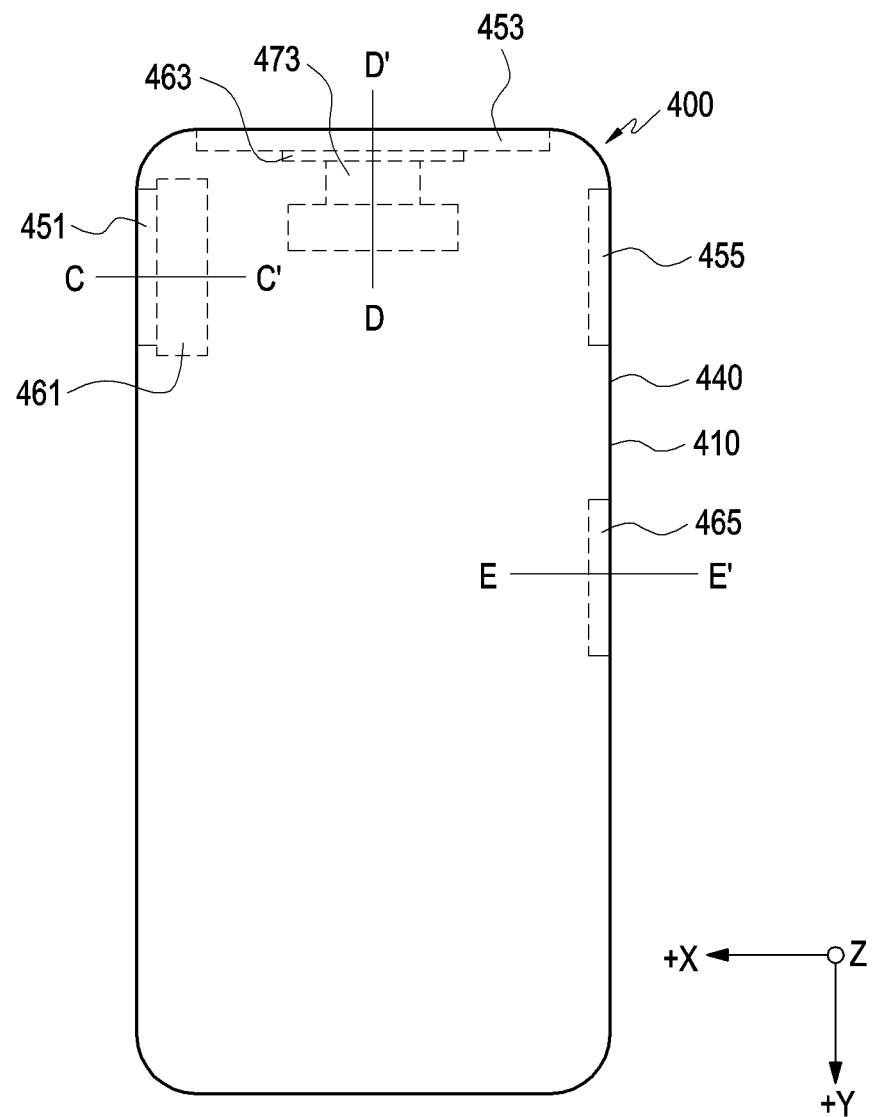
FIG. 4A illustrates an electronic device including an antenna module according to an embodiment.

FIG. 4A illustrates an electronic device including an antenna module according to an embodiment.

Figure 4B:
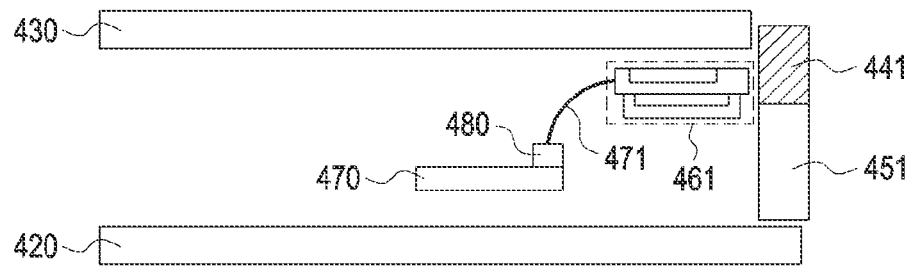
FIG. 4B illustrates an electronic device including an antenna module, taken along line C-C' of FIG. 4A.
Figure 4C:
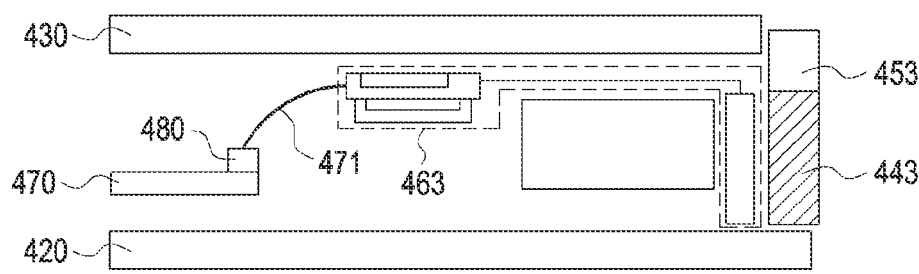
FIG. 4C illustrates an electronic device including an antenna module, taken along line D-D' of FIG. 4A.
Figure 4D:
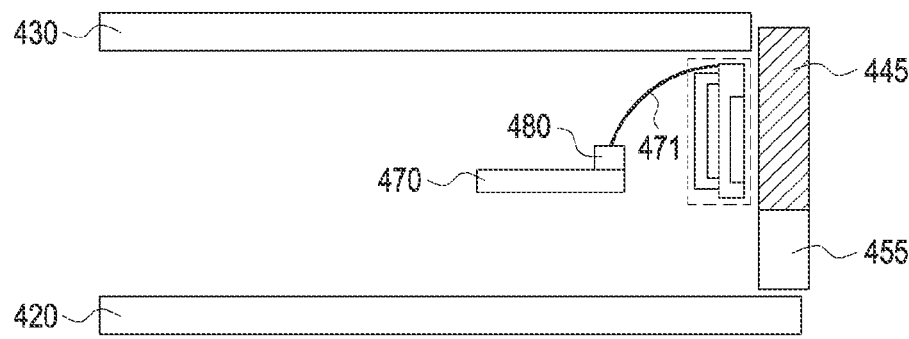
FIG. 4D illustrates an electronic device including an antenna module, taken along line E-E' of FIG. 4A.

FIG. 4B illustrates an electronic device including an antenna module, taken along line C-C' of FIG. 4A. FIG. 4C illustrates an electronic device including an antenna module, taken along line D-D' of FIG. 4A. FIG. 4D illustrates an electronic device including an antenna module, taken along line E-E' of FIG. 4A.

Referring to FIGS. 4A to 4D, an electronic device 400 includes a housing 410 that includes a first plate 420 (e.g., the front plate 220 of FIG. 2C), a second plate 430 (e.g., the back plate 280 or rear glass of FIG. 2C) spaced apart from the first plate 420 and facing in the opposite direction, and a side surface member 440 surrounding a space between the first plate 420 and the second plate 430.

The first plate 420 may include a transparent material including a glass plate. The second plate 430 may include a non-conductive and/or conductive material. The side surface member 440 may include a conductive material and/or a non-conductive material. At least a portion of the side surface member 440 may be integrally formed with the second plate 430. As illustrated in FIG. 4, the side surface member 440 includes a first insulator to a third insulator 441, 443, and 445, and a first conductor to a third conductor 451, 453, and 455.

The electronic device 400 may include, in the space, a display disposed to be seen through the first plate 420, a main PCB 470, and/or a mid-plate. Optionally, the electronic device 400 may further include other various components.

The electronic device 400 includes, in the space and/or part (e.g., the side surface member 440) of the housing 410, a first legacy antenna 451, a second legacy antenna 453, and a third legacy antenna 455. The first to third legacy antennas 451 to 455 may be used for, e.g., cellular communication (e.g., 2G, 3G, 4G, or LTE), short-range communication (e.g., Wi-Fi, Bluetooth, or NFC), and/or GNSS.

The electronic device 400 includes a first antenna assembly 461, a second antenna assembly 463, and a third antenna assembly to form directional beams. The antenna modules 461, 463, and 465 may be used for 5G network (e.g., the second cellular network 394 of FIG. 3), mmWave communication, 60 GHz communication, or WiGig communication. The antenna modules 461, 463, and 465 may be disposed in the space to be spaced a predetermined interval or more apart from the metal members (e.g., the housing 410, the internal component 473, and/or the first to third legacy antennas 451 to 455).

The first antenna assembly 461 may be positioned at the left top (+X axis), the second antenna assembly 463 may be positioned at the middle top (−Y axis), and the third antenna assembly 465 may be positioned at the right middle (−X axis). The electronic device 400 may include additional antenna modules in additional positions (e.g., the middle bottom (Y axis)), or some of the first to third antenna modules 461 to 465 may be omitted. The first to third antenna modules 461, 463, and 465 may be electrically connected with at least one CP 480 on the main PCB 470 using a conductive line 471 (e.g., a coaxial cable or flexible printed circuit board (FPCB)).

Referring to FIG. 4B, which is a cross-sectional view taken along line C-C' of FIG. 4A, the antenna array of the first antenna assembly 461 may be disposed so that a portion (e.g., a patch antenna array) of the antenna array of the first antenna assembly 461 may emit radiations towards the second plate 430, and another portion (e.g., a dipole antenna array) thereof may emit radiations through the first insulator 441.

Referring to FIG. 4C, which is a cross-sectional view taken along line D-D' of FIG. 4A, the antenna array of the second antenna assembly 463 may be disposed so that a portion (e.g., a patch antenna array) of the radiator of the second antenna assembly 463 may emit radiations towards the second plate 430, and another portion (e.g., a dipole antenna array) thereof may emit radiations through the second insulator 443.

The second antenna assembly 463 may include a plurality of PCBs. For example, a portion (e.g., a patch antenna array) and another portion (e.g., a dipole antenna array) of the antenna array may be positioned on different PCBs. The PCBs may be connected together via a FPCB. The FPCB may be disposed around an electric structure 473 (e.g., a receiver, speaker, sensor, camera, ear jack, or button).

Referring to FIG. 4D, which is a cross-sectional view taken along line E-E' of FIG. 4A, the third antenna assembly 465 may be disposed to face the side surface member 440 of the housing 410. The antenna array of the third antenna assembly 465 may be disposed so that a portion (e.g., a dipole antenna array) of the antenna array of the third antenna assembly 465 may emit radiations towards the second plate 430, and another portion (e.g., a patch antenna array) thereof may emit radiations through the third insulator 445.

Figure 5A:
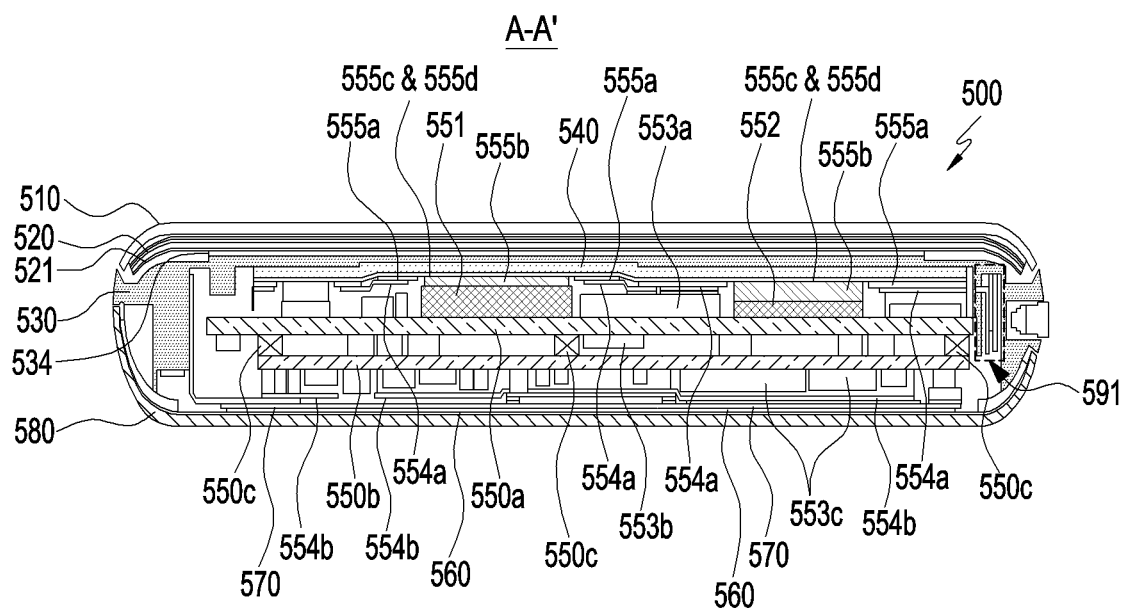
FIG. 5A illustrates a cross-sectional view of an electronic device according to an embodiment.
Figure 5B:
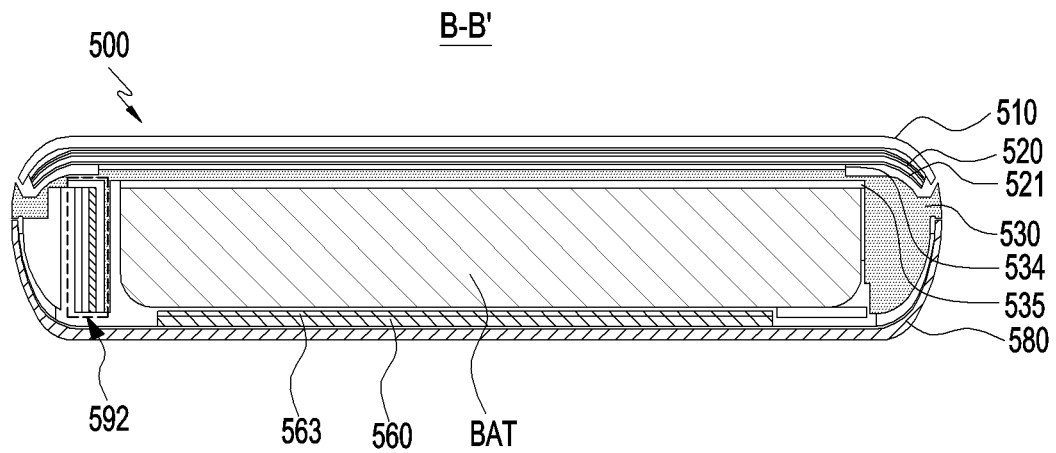
FIG. 5B illustrates a cross-sectional view of an electronic device according to an embodiment.

FIG. 5A illustrates a cross-sectional view of an electronic device according to an embodiment. FIG. 5B illustrates a cross-sectional view of an electronic device according to an embodiment. Specifically, FIG. 5A illustrates a cross-sectional view taken along line A-A' of FIG. 2A, and FIG. 5B illustrates a cross-sectional view taken along line B-B' of FIG. 5B.

Referring to FIG. 5A, an electronic device 500 includes a front plate 510, a display 520, a supporting member 530, a first heat transfer member 540, a PCB, a battery, and a back plate 580. Alternatively, the electronic device 500 may exclude at least one of the components or may add another component. The electronic device 500 further includes a heat radiating sheet 521 on the back surface of the display 520 and a third heat transfer member 534 on the top surface of the supporting member 530. The PCB may form a stacked PCB structure to secure a component mounting space corresponding to application of a half PCB. The PCB may include a first PCB 550a on which a plurality of electronic components are mounted and a second PCB 550b at least partially overlapping the first PCB 550a and electrically connected with the first PCB 550a.

The first PCB 550a and the second PCB 550b may be electrically connected with each other by a connecting member 550c and may be spaced a predetermined distance apart from each other along the height direction (e.g., the direction parallel with the +Z axis of FIG. 2C). The connecting member 550c may be disposed on the surface opposite to the surface at which the first heat transfer member 540 is formed with respect to the first PCB 550a.

The connecting member 550c may include, e.g., an interposer, a board-to-board connector, or an FPCB. At least one or more connecting members 550c may be disposed to electrically connect the first PCB 550a and the second PCB 550b.

Various electronic components may be mounted on the first PCB 550a and/or the second PCB 550b.

Referring to FIG. 5A which is a cross-sectional view taken along line A-A' of FIG. 2A, the stacked structure of the plurality of electronic components and the PCB may take up most of the space in the electronic device 500.

For example, processors 551 and 552 may be mounted on the first PCB 550a. The processors 551 and 552 may include one or more of a CPU, an AP, a GPU, an ISP, or a baseband processor (or CP). The processors 551 and 552 may be implemented in a system-on-chip (SoC) or system-in-package (SiP). Various electronic components may be mounted on the first PCB 550a and/or the second PCB 550b. For example, a control circuit may also be configured in an IC chip and mounted on the PCB. The control circuit may be part of the processor or the communication module. Other various electronic components 553a may further be mounted on the first PCB 550a.

Some electronic component 553b among the electronic components mounted on the first PCB 550a and/or the second PCB 550b may be disposed in an area between the first PCB 550a and the second PCB 550b, and another 553c may be mounted on one surface or its opposite surface of the second PCB 550b. Thus, even when the electronic device 500 forms a half PCB structure, more space may be secured for placing the battery without a substantial reduction in the mounting space for electronic components. At least some of the electronic components may be surrounded by a shield can 554a and 554b, and a shielding structure may be formed on one surface of at least some of the electronic components to protect the electronic components from external electromagnetic influence.

At least one heat transfer member (e.g., 540) may be provided inside the electronic device 500 to efficiently transfer the heat generated from the electronic components to a relatively low-temperature part.

As illustrated in FIG. 5A, the electronic device 500, at cross-sectional view, includes an electronic component 551, a shield can 554a and a shielding structure, a heat transfer member, a supporting member 530, a heat radiating sheet 521, a display 520, and a front plate 510 which are sequentially arranged towards one surface, with a PCB (e.g., the first PCB 550a) used as a base. The electronic device 500 include a third heat transfer member 534 disposed between the supporting member 530 and the display 520 in addition to the first heat transfer member 540 disposed between the supporting member 530 and the PCB (e.g., the first PCB 550a), as heat transfer members. The electronic device 500, at cross-sectional view, includes an electronic component 553c, a shield can 554b, an antenna 560, a second supporting member 570, and a back plate 580, which are sequentially arranged towards the opposite surface, with a PCB (e.g., the second PCB 550b) used as a base.

The shielding structure includes a shielding member 555a, heat transfer materials 555b and 555d, and a metal plate 555c. The shielding structure may be disposed between the first heat transfer member 540 and the electronic component 551 to shield the electronic component 551 from the ambient electromagnetic waves and may be thermally coupled with the first heat transfer member 540.

At least a partial area of the first heat transfer member 540 may be disposed to face at least one electronic component 551 among a plurality of electronic components mounted on the PCB 550, and at least another partial area, which is bent may be disposed to face another electronic component 552 among the plurality of electronic components mounted on the PCB 550.

The electronic device 500 further includes an antenna module 591. Since the antenna module 591 is spaced apart from the heat transfer member and is vertically mounted on one side surface of the electronic device 500, as illustrated in FIG. 5A, a separate heat transfer component may be provided for the antenna module 591.

As illustrated in FIG. 5B, which is a cross-sectional view taken along line B-B' of FIG. 2A, the battery may occupy most of the space of the electronic device 500 in another cross section. Since no other component (e.g., a PCB) than the battery is included on one surface of the electronic device 500, a larger-capacity battery may be advantageously placed.

Referring to FIG. 5B, the electronic device 500 includes a second heat transfer member 535. The second heat transfer member 535 may be disposed between the supporting member 530 and the battery.

As illustrated in FIG. 5B, the electronic device 500, at cross-sectional view, includes a back plate 580, and the electronic device 500 includes an antenna 560, a heat radiating sheet 563, a battery, a heat transfer member, a supporting member 530, a heat radiating sheet 521, a display 520, and a front plate 580, which are sequentially arranged from the back plate 580 to one surface. The electronic device 500 may include a third heat transfer member 534 disposed between the supporting member 530 and the display 520 in addition to the second heat transfer member 535 disposed between the supporting member 530 and the battery (BAT), as heat transfer members.

The electronic device 500 further includes an antenna module 592. Since the antenna module 592 is spaced apart from the heat transfer member and is vertically mounted on one side surface of the electronic device 500, as illustrated in FIG. 5B, a separate heat transfer means may be provided for the antenna module 592.

Figure 6:
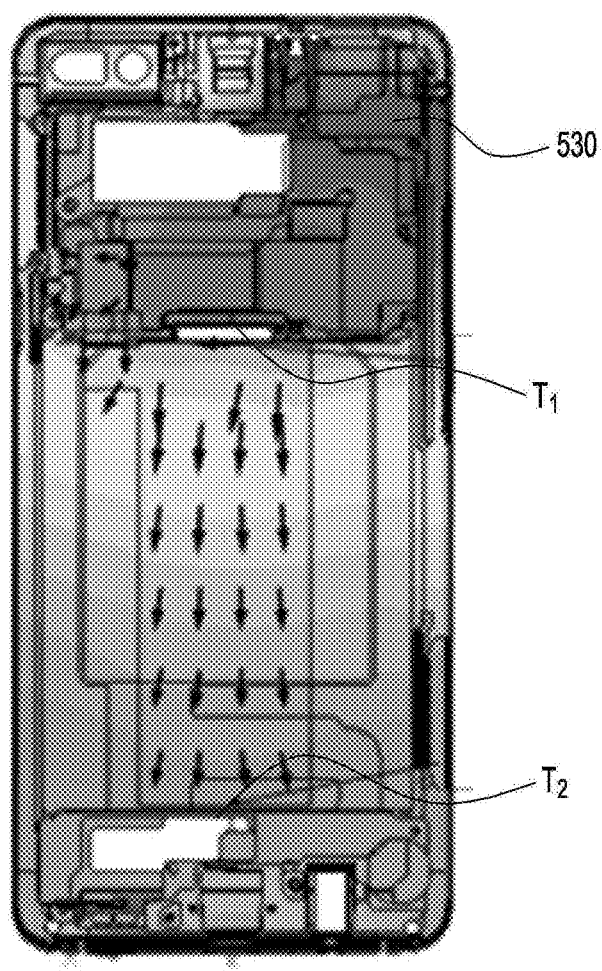
FIG. 6 illustrates a heat distribution and heat spread direction of components of an electronic device according to an embodiment.

FIG. 6 illustrates a heat distribution and heat spread direction of components of an electronic device according to an embodiment.

Referring to FIG. 6, for a half PCB structure or a stacked PCB structure in which high-performance electronic components, such as an AP, a memory, or a communication chip, are mounted, the heat generated from the electronic components when the electronic device operates may be concentrated at some area (e.g., a hot-spot area on one side of the PCB). For example, more heat may be generated at the processor and the antenna modem among other various electronic components mounted on the PCB in the electronic device.

Thus, it may be beneficial to effectively spread/dissipate the heat concentrated at the hot-spot area to a relatively low-temperature part (e.g., the battery mounted area of the electronic device).

Various heat transfer elements may be used to spread/dissipate the concentrated heat, e.g., a vapor chamber, a heat pipe, a shield can, a solid thermal sheet, or a liquid heat radiating paint. Heat transfer by various heat transfer elements may encompass heat conduction, heat spreading, heat diffusion, heat radiation, or other various types of moving thermal energy.

Figure 7:
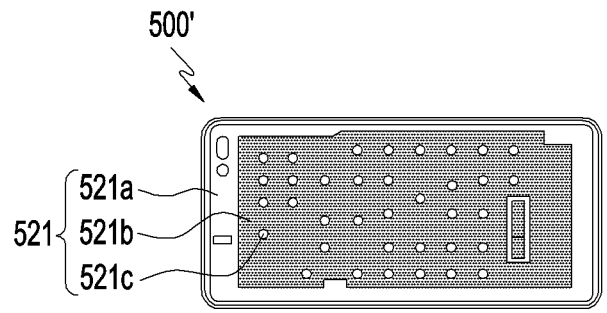
FIG. 7 illustrates a heat radiating sheet positioned on a back surface of a display according to an embodiment.

FIG. 7 illustrates a heat radiating sheet positioned on a back surface of a display according to an embodiment. More specifically, FIG. 7 illustrates a plan view of the electronic device 500' with some components (e.g., the front plate and the display) excluded from the electronic device 500.

Referring to FIG. 7, the electronic device 500' includes a heat radiating sheet 521 disposed on the back surface of the display.

The heat radiating sheet 521 is a component for radiating the heat that may be generated when the display operates. The heat radiating sheet 521 may be attached to the back surface of the display via an attaching member.

The heat radiating sheet 521 may be formed of a composite sheet resulting from stacking two or more sheets 521a and 521b. At least a portion of the heat radiating sheet 521 may include a carbon-based material (e.g., carbon black, graphene, carbon nano tube, or graphite) with high thermal conductivity or thermal transfer efficiency. A through hole 521c may be formed in at least a portion of the composite sheet of the heat radiating sheet 521 so as to increase heat radiation efficiency.

For example, the heat radiating sheet 521 is formed of a composite sheet that is about 32 μm thick. At least a portion of the heat radiating sheet 521 includes graphite. As the heat radiating sheet 521 is included in the electronic device 500', the temperature measured at the front part of the electronic device 500' may be reduced by about 0.5° C. to 1° C. (as compared with when the heat radiating sheet 521 is not utilized.

Figure 8:
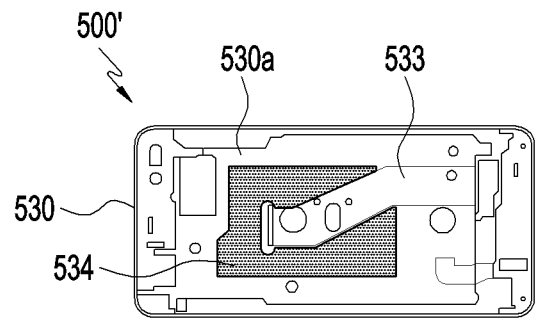
FIG. 8 illustrates a third heat transfer member positioned on a top surface of a supporting member according to an embodiment.

FIG. 8 illustrates a third heat transfer member positioned on a top surface of a supporting member according to an embodiment. Specifically, FIG. 8 is a plan view of the electronic device 500' with some components (e.g., the front plate and the display) excluded from the electronic device 500.

Referring to FIG. 8, the third heat transfer member 534 is coupled to the top surface 530a of the supporting member 530 to transfer heat from one side (e.g., the top end) of the supporting member 530 to the other side (e.g., the bottom end) of the supporting member 530, which is relatively low in temperature.

On the top surface of the supporting member 530, at least a portion of the third heat transfer member 534 may be disposed in a position corresponding to the first area (S1 of FIG. 2C) of the housing, and at least another portion thereof may be disposed in a position corresponding to the second area (S2 of FIG. 2C) of the housing. If the third heat transfer member 534 is added, the third heat transfer member 534 may be extended in the lengthwise direction (e.g., y of FIG. 2C) of the electronic device to be seen from one cross section (e.g., FIG. 5A) of the electronic device 500 and another cross section (e.g., FIG. 5B) of the electronic device 500.

The third heat transfer member 534 may come in various shapes. As illustrated in FIG. 8, the third heat transfer member 534 may be shaped to cover the top surface of the supporting member 530 in the part except for the component mounting area 533 of the supporting member 530. The shape of the third heat transfer member 534 is not limited thereto, and various shapes may be utilized.

The third heat transfer member 534 may include a carbon-based material (e.g., carbon black, graphene, carbon nano tube, or graphite) with high thermal conductivity or thermal transfer efficiency. As the electronic device 500' includes the third heat transfer member 534, which is about 62 μm thick and at least a portion of which contains graphite, the temperature measured at the front part may be decreased by about 0.5° C. to 1° C., and the temperature at the back part of the electronic device 500 may be decreased by about 0.25° C. to 0.5° C. as compared with when the third heat transfer member 534 is not included.

Figure 9:
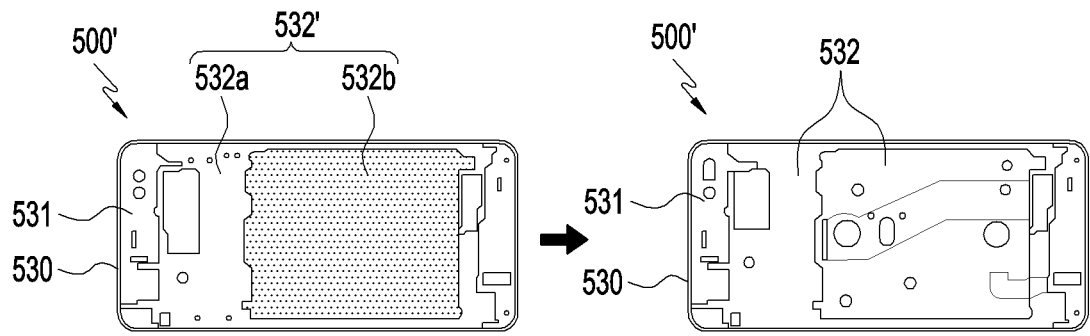
FIG. 9 illustrates a supporting member according to an embodiment.

FIG. 9 illustrates a supporting member according to an embodiment. Specifically, FIG. 9 illustrates a plan view of the electronic device 500' with some components (e.g., the front plate, the display, and the third heat transfer member) excluded from the electronic device 500.

Referring to FIG. 9, a supporting member 530 may be formed of an integral heat conductive material. If the supporting member 530 includes a side bezel structure 531 and a seating part 532, the seating part 532 may be formed of an integral heat conductive material.

In the supporting member 530, the seating part 532' may be formed of heat conductive members of different materials, as illustrated on the left-hand view of FIG. 9.

A first seating part 532a may be formed of a member with a first thermal conductivity (e.g., a Cu plate), and a second seating part 532b may be formed of a member with a second thermal conductivity (e.g., SUS). If the seating part 532' is formed of members with different thermal conductivities, heat may be blocked by the thermal barrier between the heterogeneous materials while moving from the higher-temperature to lower-temperature portion, which may hamper efficient heat dissipation.

Thus, the supporting member 530 is formed of an integral heat conductive material (e.g., a full aluminum (Al) alloy) with high heat transfer efficiency, preventing blockage of heat transfer by the thermal barrier between the heterogeneous materials. The use of the supporting member 530 formed of a full metal alloy (e.g., a full Al alloy) may reduce the temperature measured at the front part of the electronic device 500 by about 0.5° C. to 1.5° C. and reduce the temperature at the back part of the electronic device 500 by about 0.25° C. to about 0.75° C. as compared with an electronic device with heat conductive members of heterogeneous materials (e.g., the one illustrated on the left-hand side of FIG. 9).

Figure 10:
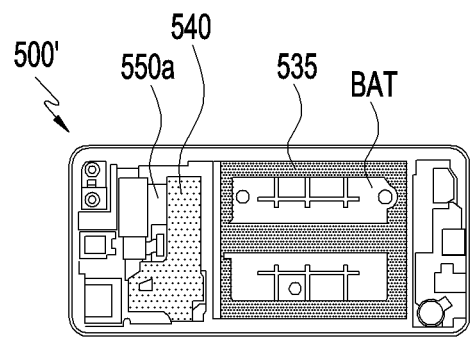
FIG. 10 illustrates a second heat transfer member positioned on a back surface of a supporting member (or on a top surface of a battery) according to an embodiment.

FIG. 10 illustrates a second heat transfer member 535 positioned on a back surface of a supporting member (or on a top surface of a battery) according to an embodiment. Specifically, FIG. 10 illustrates a plan view of the electronic device 500' with some components excluded from the electronic device 500.

The second heat transfer member 535 may be a component that is coupled to the bottom surface of the supporting member 530 to transfer heat concentrated at one side (e.g., the top end) of the supporting member 530 to the other side (e.g., the bottom end) of the supporting member 530, which is relatively low in temperature. Alternatively, the second heat transfer member 535 may be a structure coupled to the top surface of the battery. The second heat transfer member 535 may be disposed between the supporting member 530 and the battery, and the second heat transfer member 535 may transfer the heat generated from the PCB 550a to an end of the battery which is far away from the PCB 550a.

At least another portion of the second heat transfer member 535 may be disposed in a position corresponding to the second area (S2 of FIG. 2C) of the housing on the top surface of the battery or the back surface of the supporting member 530.

The second heat transfer member 535 may come in various shapes. As illustrated in FIG. 10, an opening may be formed in a portion of the surface that faces the battery. The second heat transfer member 535 may be shaped to be narrowed and elongated along the lengthwise direction while getting around the area (e.g., the battery attaching member applied area) where the battery is seated in the supporting member 530. The second heat transfer member 535 may be shaped to be extended to pass the areas near the center and edge of the battery on the top surface of the battery. The shape of the second heat transfer member 535 is not limited thereto, and other various shapes may be utilized.

The second heat transfer member 535 may include a carbon-based material (e.g., carbon black, graphene, carbon nano tube, or graphite) with high thermal conductivity or thermal transfer efficiency. As the electronic device 500' includes the second heat transfer member 535, which is about 60 μm thick and at least a portion of which contains graphite, the temperature measured at the front part may be decreased by about 0.5° C. to 1° C. as compared with when the second heat transfer member 535 is not included.

Figure 11:
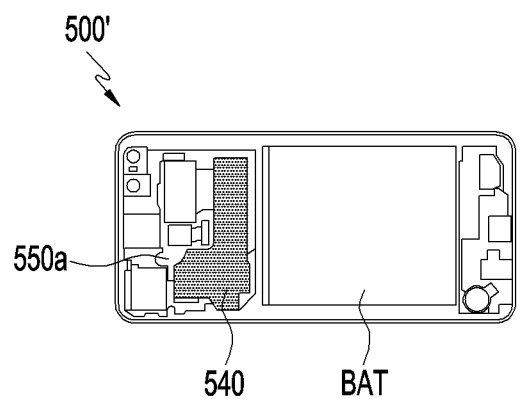
FIG. 11 illustrates a first heat transfer member positioned on a top surface of at least one electronic component mounted on a PCB according to an embodiment.

FIG. 11 illustrates a first heat transfer member positioned on a top surface of at least one electronic component mounted on a PCB according to an embodiment. Specifically, FIG. 11 illustrates a plan view of the electronic device 500' with some components excluded from the electronic device 500.

Referring to FIG. 11, the first heat transfer member 540 may be formed to cover at least a portion of the top surface of the PCB 550a where heat is concentrated. The first heat transfer member 540 may be a component to quickly spread the heat generated from an electronic component mounted on the first PCB 550a and concentrated at a portion to a relatively low-temperature area.

At least a portion of the first heat transfer member 540 may be disposed in a position corresponding to the first area (S1 of FIG. 2C) of the housing on the top surface of the first PCB 550a.

The first heat transfer member 540 may come in various shapes. As illustrated in FIG. 11, the first heat transfer member 540, when viewed from above the top surface, may be overall L-shaped, but is not limited thereto. The shape of the first heat transfer member 540 may vary depending on the kind and arrangement of the electronic components on the PCB 550a.

The first heat transfer member 540 may include a vapor chamber. The vapor chamber may have at least a portion (e.g., the back surface of the first heat transfer member 540) that faces one surface where heat is radiated from the electronic component mounted on the first PCB 550a. The first heat transfer member 540 may receive heat through the back surface. As the inside of the first heat transfer member 540 is a vacuum, the heat received from the electronic component may quickly be spread in the horizontal direction.

For example, the first heat transfer member 540 may be treated to be internally vacuum and may be a thermal conductor filled with an operation fluid. If heat is applied to any one portion of the first heat transfer member 540, the liquid operation fluid may evaporate, causing a pressure difference. The pressure difference allows the gaseous operation fluid to move relatively fast to a relatively low-temperature area. This principle may be adopted for the first heat transfer member 540.

The first heat transfer member 540 may be used together with at least one of the second heat transfer member 535 and/or the third heat transfer member 534. Since the first heat transfer member 540 is disposed between the supporting member 530 and the first PCB 550a, and the second heat transfer member 535 and/or the third heat transfer member 534 cover up to the area where the first heat transfer member 540 is not disposed, the heat concentrated at one side (e.g., the top end) of the supporting member 530 may be transferred to the opposite side (e.g., the bottom end) of the supporting member 530, which is relatively low in temperature. This leads to transfer of the heat generated from the PCB to the end of the battery, which is positioned far away from the PCB.

Figure 12:
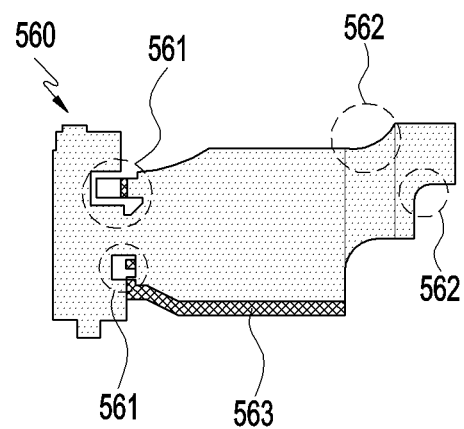
FIG. 12 illustrates a heat radiating sheet positioned on a back surface of a wireless charging antenna according to an embodiment.

FIG. 12 illustrates a wireless charging antenna and a heat radiating sheet disposed between the wireless charging antenna and a battery according to an embodiment.

Referring to FIG. 12, if the electronic device includes the wireless charging antenna 560, the temperature around the wireless charging antenna 560 may soar when the battery is charged. The heat radiating sheet 563 may be disposed near the wireless charging antenna 560 to transfer the generated heat to a relatively low-temperature portion. The heat radiating sheet 563 may be disposed between the wireless charging antenna 560 and the battery.

The shape of the wireless charging antenna 560 may vary depending on the specifications of the antenna, relationship in arrangement with other components in the electronic device, and/or the shape of the shielding structure.

When the wireless charging antenna 560 is shaped as a flat plate, as illustrated in FIG. 12, the heat radiating sheet 563 may be extended up to a portion, e.g., a segmented portion 561 or bend 562, of the wireless charging antenna 560 that does not influence signal transmission/reception efficiency, thereby increasing the heat transfer efficiency.

Figure 13:
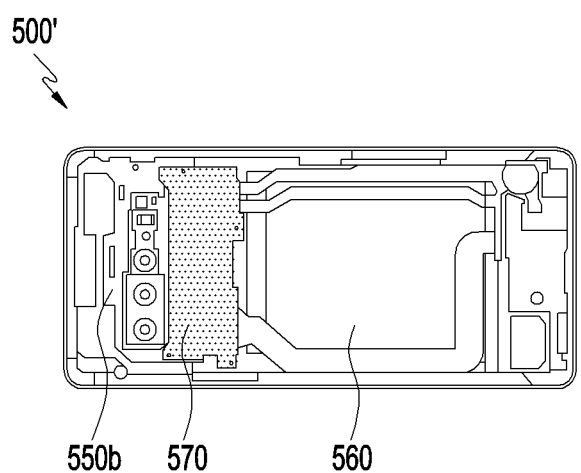
FIG. 13 illustrates a clad sheet according to an embodiment.

FIG. 13 illustrates a second supporting member according to an embodiment. Specifically, FIG. 13 illustrates a rear view of the electronic device 500' with some components excluded from the electronic device 500.

Referring to FIG. 13, a second supporting member 570 may be added adjacent to the back plate. The second supporting member 570 may at least partially include an injection-molded material. For example, a partially separated portion of the second supporting member 570 may be formed of an injection-molded material, and the other separated portion may be formed of a clad plate (or clad metal). As another example, the second supporting member 570 may be a single structure formed by double injection molding.

If it is hard to implement an injection-molded material in a lower part of the PCB (e.g., a lower part of the second PCB 550b) due to the PCB stack structure, the second supporting member 570 may include a clad plate in the lower part where it is difficult to implement an injection-molded material.

The overall second supporting member 570 may be formed of a clad plate. Typically, the back plate is substantially opaque and may include an injection-molded material or may partially include a heat radiating sheet such as SUS. As the heat radiating sheet is implemented as a clad plate, heat transfer efficiency may be enhanced. The clad plate may include a first material in the core and a second material in the upper and/or lower layer surrounding the core.

As Cu is used as the core of the clad plate, and SUS is used as the surrounding layer (e.g., a SUS/CU/SUS clad plate), thermal conductivity may be enhanced by a few more times (e.g., 0.04 cal/sec for SUS, 0.35 cal/sec for Clad) as compared with when the clad plate is not used.

If the second supporting member 570 is formed of the clad plate, the temperature measured at the back part of the electronic device may be reduced by about 0.5° C. to about 1° C.

Figure 14:
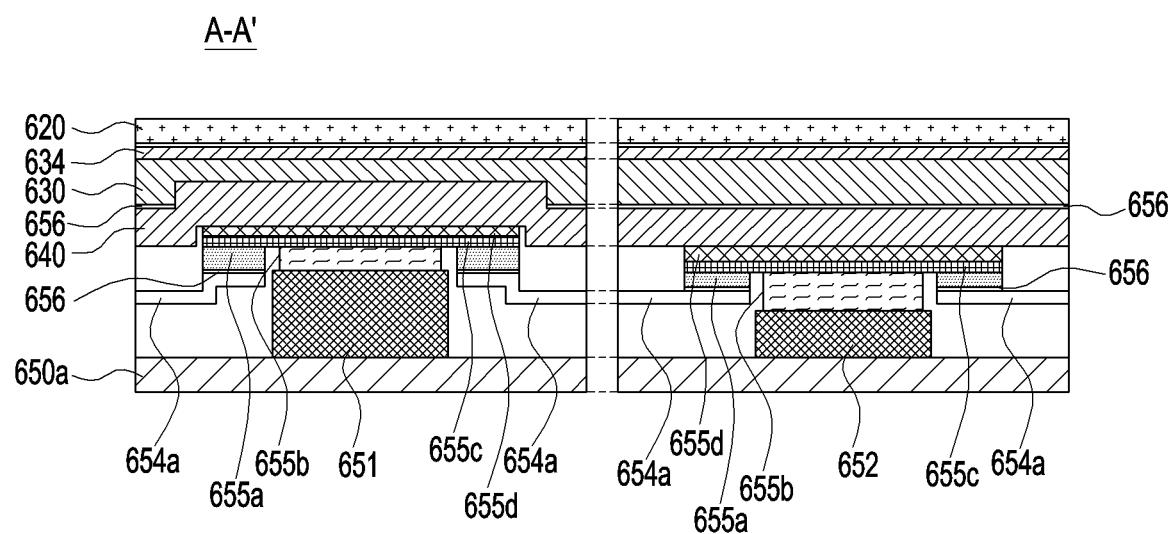
FIG. 14 illustrates an arrangement of an electronic component, a shielding structure, and a first heat transfer member according to an embodiment.

FIG. 14 illustrates an arrangement of an electronic component, a shielding structure, and a first heat transfer member according to an embodiment.

Referring to FIG. 14, various electronic components may be mounted on the first PCB 650a. The electronic components may have various shapes, sizes, and specifications depending on their functions. The electronic components may generate different amounts of heat as they perform various functions of the electronic device. Typically, more heat may be generated from an electronic component, e.g., a processor, for controlling and managing other electronic components. Processors may include a first processor 651 and a second processor 652. The first processor 651 and the second processor 652 may have different levels. For example, the first processor 651 may be higher than the second processor 652.

The first heat transfer member 640 may be formed to face the top surface of the first processor 651 and the second processor 652.

The first heat transfer member 640 may connect to the first processor 651 and the second processor 652 indirectly via at least one shielding structure 655, rather than directly touching the first processor 651 and the second processor 652.

At least some 651 and 652 of electronic components mounted on the first PCB 650a may be surrounded by the shield can 654a, and a shielding structure may be provided on one surface of at least some electronic components among the electronic components to shield electromagnetic waves.

The shielding structure further includes a shielding member 655a electrically connected with the shield can 654a, a metal plate 655c electrically connected with the shielding member 655a, and a heat transfer material disposed on at least one surface of the metal plate 655c.

The shielding structure may include a shielding member 655a disposed to surround an outer surface of the shield can 654a and an opening formed in a surface corresponding to an electronic component of the shield can 654a and electrically connected with the shield can 654a, a metal plate 655c disposed over the shielding member 655a, with the opening covered, and electrically connected with the shielding member 655a, a first heat transfer material 655b disposed to touch the electronic component and the metal plate 655c in the opening, and a second heat transfer material 655d disposed between the metal plate 655c and the first heat transfer member 640 to touch the metal plate 655c and the first heat transfer member 640.

The shielding member may include a shielding film and polyurethane (PU), at least a portion of which is surrounded by the shielding film. The shielding film may be a nano fiber-based conductive film. A shielding structure resulting from surrounding a PU foam with the nano fiber shielding film may be referred to as a nano foam. The first heat transfer material 655b and 655d may include a liquid or solid thermal interface material (TIM). The solid or liquid TIM may include, e.g., graphite, carbon nano tube (CNT), natural recyclable substance, silicone, silicon, or other high thermal conducting substance.

The heat generated from the electronic components 651 and 652 may be thermally coupled with the first heat transfer member 640 via at least a portion (e.g., 655b, 655c, and 655d) of the shielding structure.

The first heat transfer member 640 may be stepped corresponding to the step between the first processor 651 and the second processor 652. However, the step formed in the first heat transfer member 640 need not be identical in height or level to the step between the first processor 651 and the second processor 652 but may vary depending on various combinations and shapes of the heat transfer materials. At least a partial area of the first heat transfer member 640 may be formed to face the first processor 651, and at least another partial area of the first heat transfer member 640, which is bent may be formed to face the second processor 652.

The electronic device may further include an attaching member 656 between the shield can 654a and the shielding member and/or between the first heat transfer member 640 and the supporting member 630.

Figure 15A:
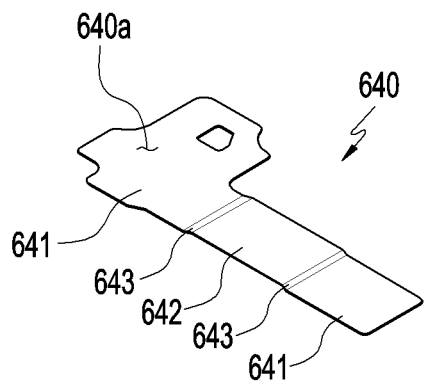
FIG. 15A illustrates a first heat transfer member according to an embodiment.
Figure 15B:
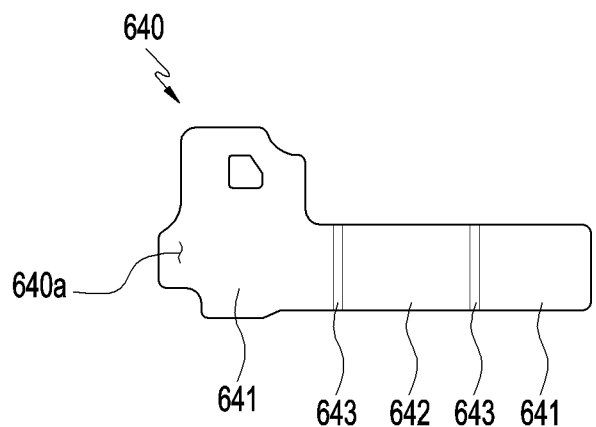
FIG. 15B illustrates a front view of a first heat transfer member according to an embodiment.
Figure 15C:
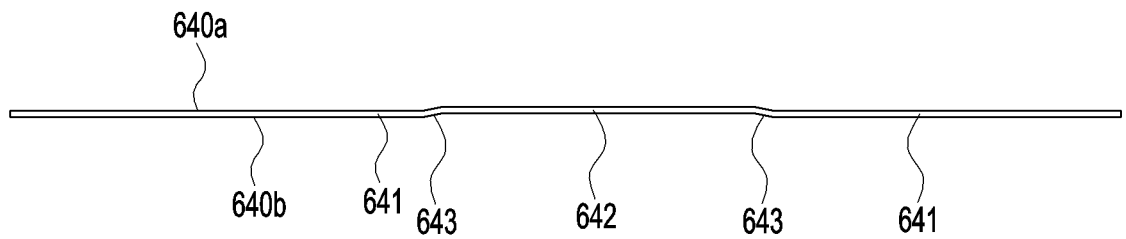
FIG. 15C illustrates a side view of a first heat transfer member according to an embodiment.

FIG. 15A illustrates a perspective view of a first heat transfer member according to an embodiment. FIG. 15B illustrates a front view of a first heat transfer member according to an embodiment. FIG. 15C illustrates a side view of a first heat transfer member according to an embodiment.

Referring to FIG. 15A, the first heat transfer member 640 may be bent at least once so that the partial area is stepped from the other partial area.

The first heat transfer member 640 includes a first flat portion 641 and a second flat portion 642 extended from the first flat portion 641 and bent to be stepped from the first flat portion 641.

Referring to FIGS. 15A to 15C, the bend 643 of the first heat transfer member 640 ¬ may have at least one shape of "B" "L," or "Z." The first heat transfer member 640 may have other various bent shapes than those enumerated above.

Although FIGS. 15A to 15C illustrate that the first heat transfer member 640 has two bends 643, the disclosure is not limited thereto. The first heat transfer member 640 may include a single bend 643 or three or more bends 643. The first heat transfer member 640 may further include other flat portions stepped from each of the first flat portion 641 and the second flat portion 642 than the first flat portion 641 and the second flat portion 642.

The specific shape of the first heat transfer member 640 may vary depending on the kind and size of the electronic component disposed on the back surface 640b of the first heat transfer member 640 and the amount of heat generated from the electronic component.

Figure 16:
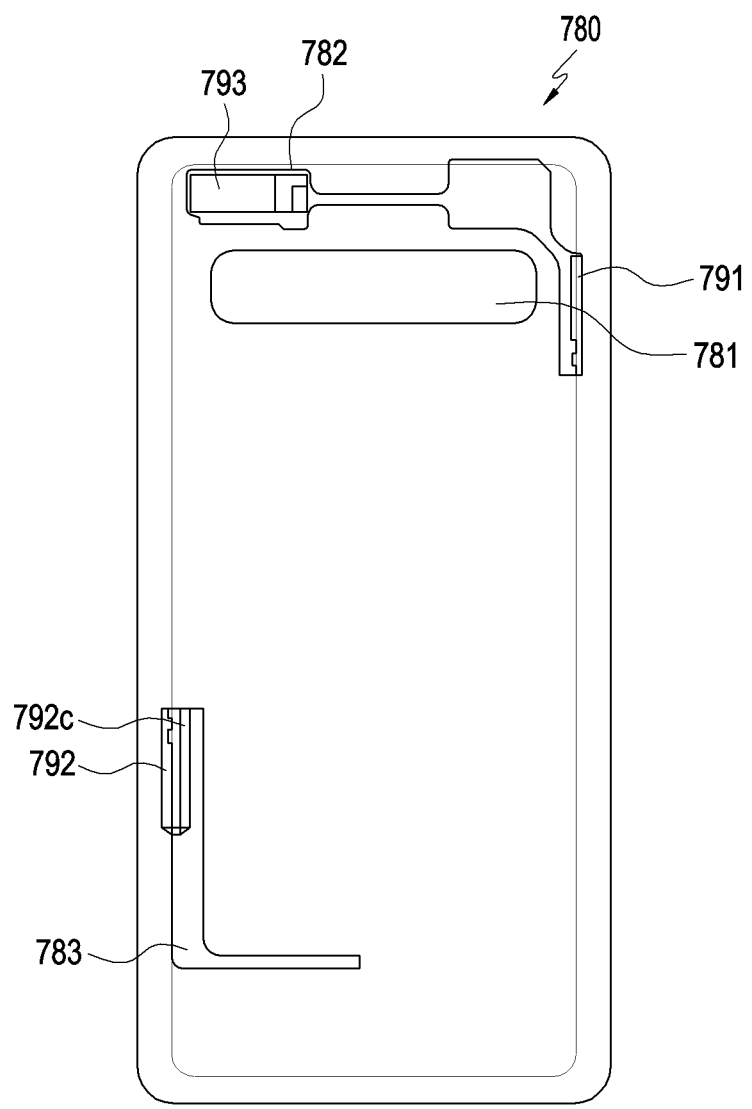
FIG. 16 illustrates an antenna module and a low-permittivity heat radiating sheet according to an embodiment.

FIG. 16 illustrates an antenna module and a low-permittivity heat radiating sheet according to an embodiment.

Referring to FIG. 16, a battery and various electronic components may be placed in the internal space of the electronic device. Additionally, antenna modules 791, 792, and 793 and heat radiating sheets 782 and 783 are positioned adjacent to each other in the internal space of the electronic device.

The antenna modules 791, 792, and 793 may include a PCB formed of a plurality of conductive layers, an RFIC disposed on one surface of the PCB, a PMIC, and an antenna radiator disposed on the opposite surface, or inside, of the PCB.

The antenna modules 791, 792, and 793 may form various directional beams. The first antenna module 791 and the second antenna module 792 may be arranged (vertically mounted) so that one surface of the antenna radiator faces a side surface of the electronic device in order to radiate electromagnetic waves to the side surface. The first antenna module 791 and the second antenna module 792 may be spaced apart from each other to radiate electromagnetic waves in different directions (e.g., in the vertical direction or the opposite direction). The third antenna module 793 may be disposed (horizontally mounted) so that one surface of the antenna radiator faces the back plate 780 in order to radiate electromagnetic waves to the back surface of the electronic device.

The heat radiating sheet 782 and 783 may be disposed between the first supporting member and the back plate 780.

The heat radiating sheet 782 and 783 may be attached onto the back plate 780. The heat radiating sheets 782 and 783 may be arranged in positions corresponding to the antenna modules 791, 792, and 793. For example, at least a partial area of the first heat radiating sheet 782 may face the first antenna module 791 and the third antenna module 793 and at least a partial area of the second heat radiating sheet 783 may face the second antenna module 792.

The first heat radiating sheet 782 may be disposed in a top end area of the back plate 780 and may cover one surface of the first antenna module 791 and the third antenna module 793, which faces the back plate 780. The first heat radiating sheet 782 may be formed to surround at least a portion of the surroundings of the opening 781 for exposing, e.g., a camera. As another example, the first heat radiating sheet 782 may be overall shaped as 'Γ' or '⏋' which is partially bent.

The second heat radiating sheet 783 may be spaced apart from the first heat radiating sheet 782. For example, the second heat radiating sheet 783 may be disposed in a bottom middle area of the back plate 780 and may cover the surface of the second antenna module 792 that faces the back plate 280. As another example, the second heat radiating sheet 783 may extend from the area where the second antenna module 792 is disposed to the lower end of the back plate 280. The second heat radiating sheet 783 may be overall shaped as '⌊' or '⌋' which is partially bent.

Although two heat radiating sheets 782 and 783 are illustrated in FIG. 16, the disclosure is not limited thereto. For example, three or more separated heat radiating sheets may be provided to cover three antenna modules.

The heat radiating sheets 782 and 783 may include a binder resin and a ceramic filler. The heat radiating sheets 782 and 783 may further include a high heat-radiating filler. The high heat-radiating filler may be coated with a low-permittivity insulating material.

The thickness of the heat radiating sheets 782 and 783 may range from 50 μm to 1,000 μm.

At least one heat radiating sheet may be spaced apart from at least one antenna module and attached to the housing.

Figure 17A:
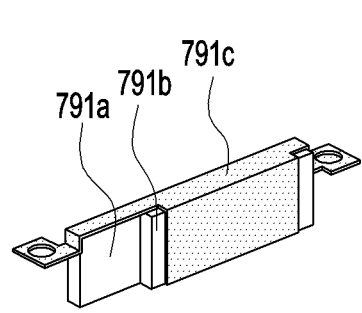
FIG. 17A illustrates a mounting structure of a vertically-mounted antenna module according to an embodiment.
Figure 17B:
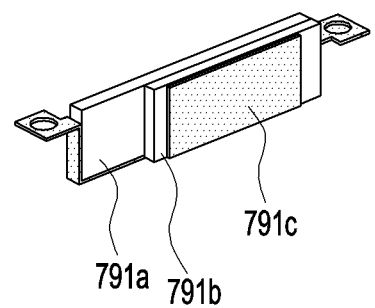
FIG. 17B illustrates a vertically-mounted antenna module according to an embodiment.
Figure 17C:
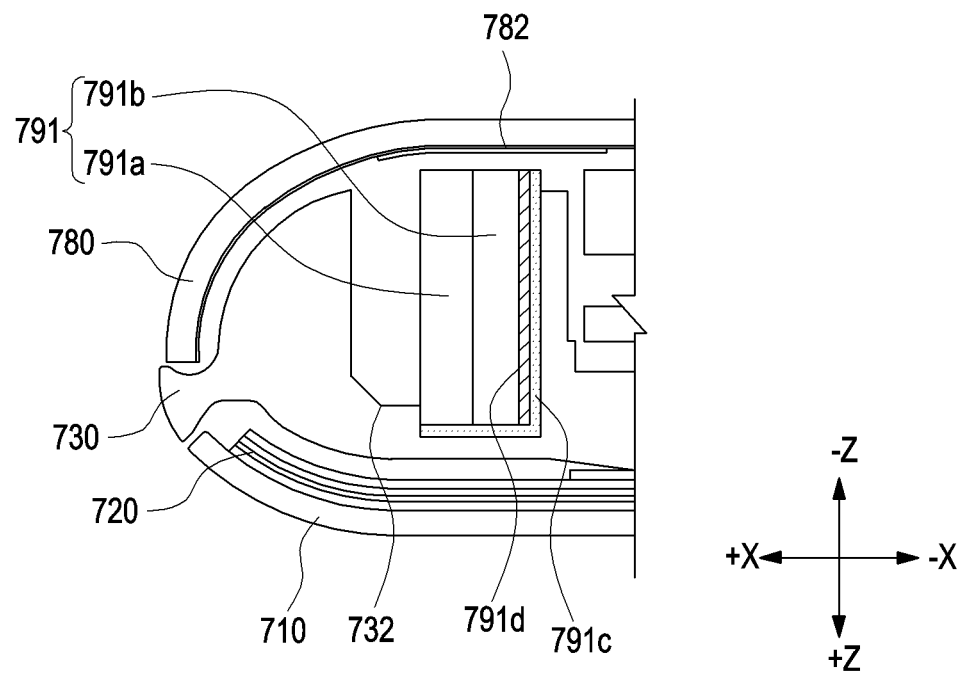
FIG. 17C illustrates a cross-sectional view of a mounting structure of a vertically-mounted antenna module according to an embodiment.

FIG. 17A illustrates a mounting structure of a vertically-mounted antenna module according to an embodiment. FIG. 17B illustrates a vertically-mounted antenna module according to an embodiment. FIG. 17C illustrates a cross-sectional view of a mounting structure of a vertically-mounted antenna module according to an embodiment.

Referring to FIG. 17A, a first antenna module (e.g., antenna module 791 of FIG. 16) and the second antenna module (e.g., antenna module 792 of FIG. 16) may be vertically-mounted antenna modules.

The vertically-mounted antenna module includes a PCB 791b and a radiator 791a disposed to face the outside of the electronic device on the PCBPCB 791b.

An RFIC, a PMIC, a connector, and other various electronic components may be disposed on the PCB 791b of the vertically-mounted antenna module. The antenna radiator 791a may be disposed on one surface of the PCB 791b.

The antenna radiator 791a may be a plurality of conductive plates or an antenna array formed of radiating conductors, and the antenna which may have various structures may be at least one of, e.g., a patch-type antenna or a dipole-type antenna.

The RFIC may be electrically connected with the antenna radiator and may receive communication signals with a designated frequency through a wireless transceiver (e.g., an RF transceiver) or transmit received communication signals to the RF transceiver. For example, the RFIC may perform wireless communication using the plurality of conductive plates or radiating conductors under the control of the processor. The RFIC may receive control signals and power from a power management module and the processor to process communication signals received from the outside or communication signals to be sent to the outside. The RFIC may include a switch circuit to split transmit and receive signals or various amplifiers or filters to raise the quality of transmit or receive signals. As described above, the RFIC mounted on the board 791b of the vertically-mounted antenna module may be a heating source that generates heat while the electronic device operates. Although not separately described, the PMIC may also be a heating source that generates heat while the electronic device operates.

Referring to FIG. 17C, the vertically-mounted antenna module 791 may be spaced apart from the heat transfer members. Thus, a need exists for transferring, spreading, diffusing, or externally discharging the heat generated from modularized heating sources mounted in the electronic device, separately from the heat transfer members according to the above-described embodiments.

According to the embodiment illustrated in FIG. 17C, a heat radiating sheet may be placed adjacent to the vertically-mounted antenna module, reducing the heat concentrated around the antenna module. The first heat radiating sheet 782 may be spaced a designated distance apart from one surface of the first antenna module 791, which faces the back plate 780. The spacing may be filled with the air, thus allowing for even spreading to the first heat radiating sheet 782 of the heat generated from the hot-spot area.

Referring to FIGS. 17B and 17C, the vertically-mounted antenna module 791 may be vertically mounted on the supporting member 730 using a frame 791c and may be screwed and fixed using holes positioned in both side surfaces of the frame 791c. If the frame 791c is thermally coupled with the supporting member 730, the heat from the modularized heating sources may be transferred, spread, diffused, or externally discharged. A heat transfer material 791d (e.g., a TIM) may additionally be formed between the at least one antenna module and the frame 791c, thereby expanding the heat contact area.

Using the configuration of FIGS. 17A, 17B, and 17C, the temperature measured at the side of the electronic device may be reduced by about 0.5° C. to about 1° C., and the temperature of the RFIC-mounted board may be decreased by about 8° C. to 12° C.

Figure 18:
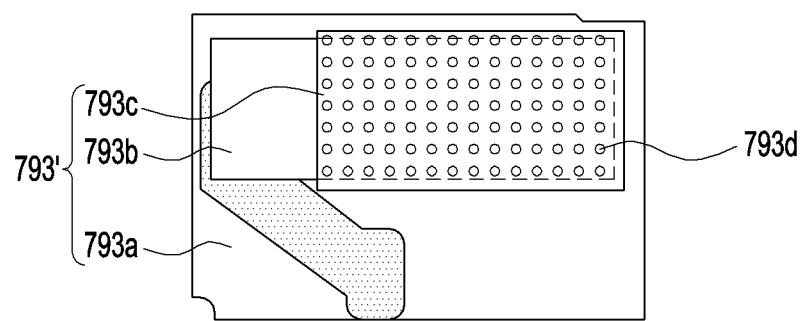
FIG. 18 illustrates a PCB of a horizontally-mounted antenna module according to an embodiment.

FIG. 18 illustrates a PCB of a horizontally-mounted antenna module according to an embodiment.

Referring to FIG. 18, at least one antenna module includes a PCB 793', which is a stack of a plurality of layers 793a, 793b, and 793c facing the seating part of the supporting member, and a via hole 793d may be formed through at least a portion of the plurality of layers in at least a partial area of the PCB 793'. An RFIC may be mounted on the PCB 793' and heat from the PCB 793' may be reduced via the via hole 793d.

The surface of the PCB 793' that faces the back surface of the antenna module 793 may connect the metal layer of the PCB included in the antenna module 793 to the back surface of the module 793 while getting around the insulating layer of the PCB included in the antenna module 793. Thus, heat dissipation may be achieved using the metal layer of the PCB.

By using the configuration of FIG. 18, the temperature of the RFIC-mounted board in the electronic device may be decreased by about 2° C. to 3C.

Figure 19:
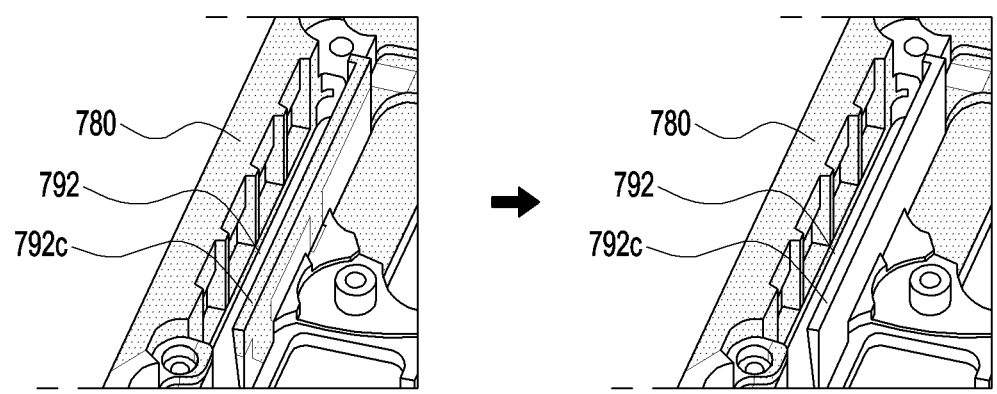
FIG. 19 illustrates a vertically-mounted antenna module and a seating part according to an embodiment.

FIG. 19 illustrates a vertically-mounted antenna module and a frame according to an embodiment.

Referring to FIG. 19, a frame 792c of the vertically-mounted antenna module 792 may typically be formed of an injection-molded material. For example, the frame 792c may be formed by processing one side of the supporting member 780 (e.g., a bracket) during the course of manufacturing the housing of the electronic device. In a similar manner to increasing heat transfer efficiency by forming the supporting member 780 of an integral full metal alloy (e.g., a full Al alloy) as described above in connection with FIG. 9, the frame 792c of the vertically-mounted antenna module 792 may be formed of an integral material (e.g., a full Al alloy) as is the supporting member 780, thereby increasing the heat transfer efficiency around the antenna module.

By using the configuration of FIG. 19, the temperature measured at the side of the electronic device may be reduced by about 0.5° C. to about 2.5° C., and the temperature of the RFIC-mounted board may be decreased by about 1.5° C. to 3° C.

Figure 20:
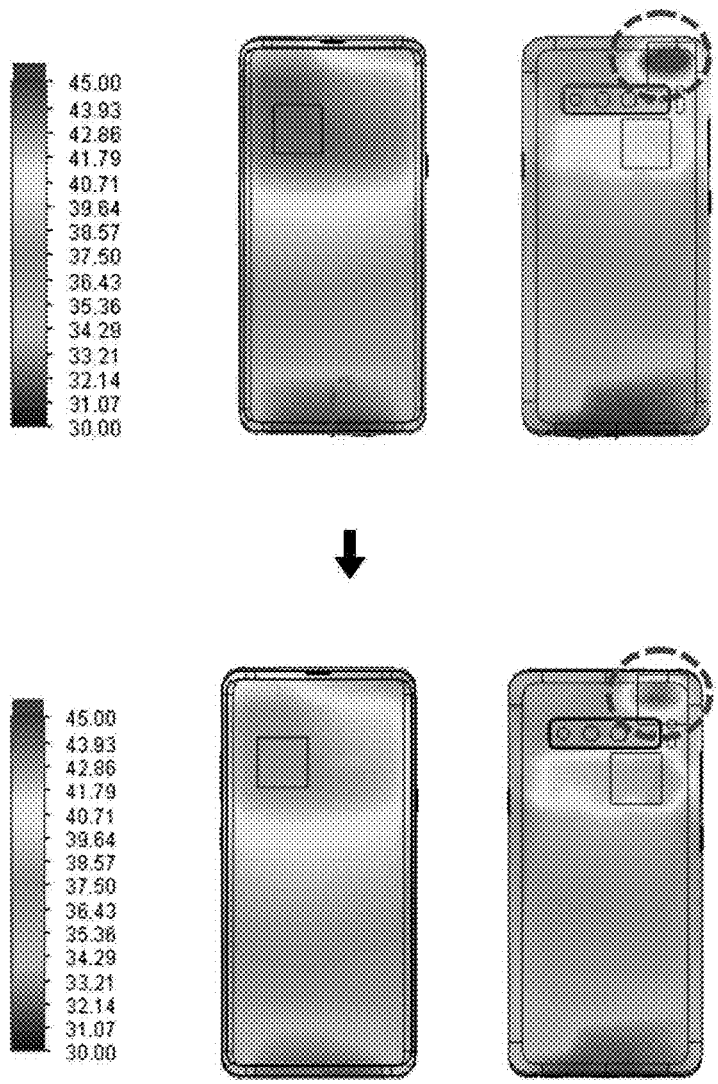
FIG. 20 illustrates a heat analysis simulation of a heat transfer member and an electronic device including the heat transfer member according to an embodiment.

FIG. 20 illustrates a heat analysis simulation of a heat transfer member and an electronic device including the heat transfer member according to an embodiment. Specifically, the upper portion of FIG. 20 illustrates a simulation result before a heat transfer member according to an embodiment is applied, and the lower portion of FIG. 20 illustrates a simulation result after a heat transfer member according to an embodiment is applied.

Referring to FIG. 20, the use of the heat radiating member and the electronic device including the same may effectively transfer the heat generated from various electronic components of the electronic device to a relatively low-temperature part.

Further, the electronic device may effective discharge the heat generated from the antenna module (e.g., an RFIC or PMIC) using the heat radiating sheet positioned adjacent to the antenna module and/or the heat transfer material.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic device is not limited to the above-listed embodiments.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to various embodiments of the disclosure may be included and provided in a computer program product. The computer program products may be traded as commodities between sellers and buyers. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

According to an embodiment, an electronic device includes a housing, a display mounted on at least one surface of the housing, a battery received in the housing, a supporting member touching a back surface of the display and supporting at least a portion of the display, a printed circuit board on which a plurality of electronic components are mounted, a shield can surrounding at least a portion of the electronic components, a shielding structure disposed on an outer surface of the shield can to shield the electronic components, and a first heat transfer member disposed on an outer surface of the shielding structure and having at least a partial area that faces at least one electronic component among the plurality of electronic components mounted on the printed circuit board and at least another partial area that is bent and faces another electronic component of the plurality of electronic components mounted on the printed circuit board.

The housing may include a first area dividing a space in the housing along a lengthwise direction from an end of the supporting member and having the printed circuit board disposed therein and a second area positioned adjacent to the first area, dividing the space in parallel with the first area, and having the battery for power supply disposed thereon.

The printed circuit board includes a first printed circuit board on which a plurality of electronic components are mounted and a second printed circuit board at least partially overlapping the first printed circuit board and electrically connected with the first printed circuit board.

The electronic device may further include a second heat transfer member disposed between the supporting member and the battery.

The electronic device may further include a third heat transfer member disposed on a surface opposite to one surface of the supporting member where the second heat transfer member is disposed. The third heat transfer member may be disposed between the display and the supporting member.

The supporting member may be formed of an integral heat conductive material.

The electronic device may further include a heat radiating sheet disposed on the back surface of the display.

The electronic device may further include a wireless charging antenna and a heat radiating sheet disposed between the wireless charging antenna and the battery.

The housing may include a front plate facing in a first direction and a back plate facing in a second direction opposite to the first direction, and a second supporting member may be included between the back plate and the printed circuit board. At least a portion of the second supporting member may include a clad plate.

The shielding structure may include a shielding member electrically connected with the shield can, a metal plate electrically connected with the shielding member, and a heat transfer material disposed on at least one surface of the metal plate. The shielding member may be formed by surrounding a PU foam with a nano fiber film.

The shielding structure includes a shielding member disposed to surround an outer surface of the shield can and an opening formed in a surface corresponding to an electronic component of the shield can and electrically connected with the shield can, a metal plate disposed over the shielding member, with the opening covered, and electrically connected with the shielding member, a first heat transfer material disposed to touch the electronic component and the metal plate in the opening, and a second heat transfer material disposed between the metal plate and the first heat transfer member to touch the metal plate and the first heat transfer member.

The electronic device may further include at least one antenna module disposed inside the housing.

There may be further included at least one heat radiating sheet spaced apart from the at least one antenna module and attached to the housing.

The at least one antenna module may include at least one antenna module vertically mounted on the supporting member via a frame, and a heat transfer material may be formed between the at least one antenna module and the frame.

The at least one antenna module may include a printed circuit board having a stack of a plurality of layers facing a seating part of the supporting member, and a via hole may be formed through at least a portion of the plurality of layers in at least an area of the printed circuit board.

According to an embodiment, an electronic device includes a housing including a front plate facing in a first direction, a back plate facing in a second direction opposite to the first direction, and a supporting member disposed between the front plate and the back plate to form a space, the housing including a first area dividing the space along a lengthwise direction from an end of the supporting member and a second area positioned adjacent to the first area and dividing the space in parallel with the first area, a printed circuit board on which a plurality of electronic components are mounted, the printed circuit board disposed in the first area, and the printed circuit board including a first printed circuit board on which a plurality of electronic components are mounted and a second printed circuit board at least partially overlapping the first printed circuit board and electrically connected with the first printed circuit board, a battery disposed in the second area, and a first heat transfer member having at least a partial area that faces at least one electronic component among the plurality of electronic components mounted on the first printed circuit board and at least another partial area that is bent and faces another electronic component among the plurality of electronic components mounted on the first printed circuit board.

The electronic device may further comprise a second heat transfer member disposed to face at least one surface of the supporting member and a third heat transfer member disposed to face an opposite surface of the supporting member. The first heat transfer member may be disposed in an area corresponding to at least a portion of the first area, the second heat transfer member may be disposed in an area corresponding to at least a portion of the second area, and the third heat transfer member may be disposed in an area corresponding to at least a portion of the first area and at least a portion of the second area.

The first heat transfer member may be disposed between the supporting member and the printed circuit board, and the first heat transfer member may have at least one bend portion to allow the at least the partial area to be stepped from the at least the other partial area.

The plurality of electronic components may include a first processor and a second processor different from the first processor.

The electronic device may further include an antenna module separately disposed from the printed circuit board and functionally connected with a communication circuit disposed on the printed circuit board.

As is apparent from the foregoing description, according to various embodiments, the use of the heat radiating member and the electronic device including the same may effectively transfer the heat generated from various electronic components of the electronic device to a relatively low-temperature part.

According to an embodiment, the electronic device may effectively discharge the heat generated from the antenna module (e.g., 5G antenna module) using the heat radiating sheet positioned adjacent to the antenna module and/or the heat transfer material. The heat radiating sheet includes a low-permittivity material, preventing an efficiency reduction in wireless communication signals.

While the disclosure has been particularly shown and described with reference to certain embodiments thereof, it will be understood by those of ordinary skill in the art that various changes in form and details may be made therein without departing from the spirit and scope of the disclosure as defined by the following claims and their equivalents.

What is claimed is:

1. An electronic device, comprising:
a housing;
a display mounted on at least one surface of the housing;
a battery;
a supporting member disposed adjacent to a back surface of the display and supporting the display;
a printed circuit board on which electronic components are mounted;
a shield can surrounding at least a portion of the electronic components;
a shielding structure disposed on an outer surface of the shield can to shield the electronic components;
a first heat transfer member disposed on an outer surface of the shielding structure and including a partial area that faces at least one electronic component among the electronic components mounted on the printed circuit board and another partial area that is bent and faces another electronic component among the electronic components mounted on the printed circuit board; and
at least one antenna module vertically mounted on the supporting member;
wherein a low-permittivity sheet and a heat transfer metal frame are disposed on the vertically mounted at least one antenna module.

2. The electronic device of claim 1, wherein the housing comprises:
a first area that divides a space in the housing along a lengthwise direction from an end of the supporting member, the first area including the printed circuit board disposed therein; and
a second area that is positioned adjacent to the first area, the second area dividing the space in parallel with the first area, and including the battery.

3. The electronic device of claim 1, wherein the printed circuit board comprises:
a first printed circuit board on which a first plurality of electronic components are mounted; and
a second printed circuit board that at least partially overlaps the first printed circuit board and is electrically connected with the first printed circuit board.

4. The electronic device of claim 1, further comprising a second heat transfer member disposed between the display and the battery.

5. The electronic device of claim 4, further comprising a third heat transfer member disposed on an opposite surface to the supporting member at which the second heat transfer member is disposed.

6. The electronic device of claim 1, wherein the supporting member is formed of an integral heat conductive material.

7. The electronic device of claim 1, further comprising a heat radiating sheet disposed on the back surface of the display.

8. The electronic device of claim 1, further comprising:
an antenna for wireless charging; and
a heat radiating sheet disposed between the antenna and the battery.

9. The electronic device of claim 1, wherein the housing comprises:
a front plate facing in a first direction; and
a back plate facing in a second direction opposite to the first direction, and
wherein a second supporting member is included between the back plate and the printed circuit board.

10. The electronic device of claim 1, wherein the shielding structure comprises:
a shielding member electrically connected with the shield can;
a metal plate electrically connected with the shielding member; and
a heat transfer material disposed on at least one surface of the metal plate.

11. The electronic device of claim 1, wherein the shielding structure comprises:
a shielding member disposed to surround the outer surface of the shield can and an opening formed in a surface corresponding to an electronic component of the shield can and electrically connected with the shield can;
a metal plate disposed over the shielding member, with the opening covered, and electrically connected with the shielding member;
a first heat transfer material disposed to touch the electronic component and the metal plate in the opening; and
a second heat transfer material disposed between the metal plate and the first heat transfer member to touch the metal plate and the first heat transfer member.

12. The electronic device of claim 1, further comprising at least one heat radiating sheet spaced apart from the at least one antenna module, the at least one heat radiating sheet being attached to the housing.

13. The electronic device of claim 1,
wherein a heat transfer material is formed between the at least one first antenna module and the heat transfer metal frame.

14. The electronic device of claim 1, wherein the at least one antenna module comprises a printed circuit board including a stack of a plurality of layers facing a seating part of the supporting member, and
wherein a via hole is formed through at least a portion of the plurality of layers in at least an area of the printed circuit board.

15. The electronic device of claim 14, further comprising:
a second heat transfer member disposed to face at least one surface of the supporting member; and
a third heat transfer member disposed to face an opposite surface of the supporting member,
wherein the first heat transfer member is disposed in an area corresponding to at least a portion of the first area, the second heat transfer member is disposed in an area corresponding to at least a portion of the second area, and the third heat transfer member is disposed in an area corresponding to at least a portion of the first area and at least a portion of the second area.

16. The electronic device of claim 1, wherein the first heat transfer member comprises a vapor chamber.

17. An electronic device, comprising:
a housing including a front plate facing in a first direction, a back plate facing in a second direction opposite to the first direction, a supporting member disposed between the front plate and the back plate to form a space, a first area dividing the space along a lengthwise direction from an end of the supporting member, and a second area positioned adjacent to the first area and dividing the space in parallel with the first area;
a printed circuit board on which a plurality of electronic components are mounted, the printed circuit board being disposed in the first area, and including a first printed circuit board on which a first plurality of electronic components are mounted and a second printed circuit board at least partially overlapping the first printed circuit board and electrically connected with the first printed circuit board;
a battery disposed in the second area; and
a first heat transfer member including a partial area that faces at least one electronic component among the first plurality of electronic components mounted on the first printed circuit board and at least another partial area that is bent and faces another electronic component among the first plurality of electronic components mounted on the first printed circuit board.

18. The electronic device of claim 17, wherein the first heat transfer member is disposed between the supporting member and the printed circuit board, and
wherein the first heat transfer member comprises at least one bend portion that steps the partial area from the at least the other partial area.

19. The electronic device of claim 17, wherein the plurality of electronic components comprise a first processor and a second processor.

20. The electronic device of claim 17, further comprising an antenna module disposed separately from the printed circuit board and functionally connected with a communication circuit disposed on the printed circuit board.

* * * * *